United States Patent
Nishinakayama et al.

(10) Patent No.: US 6,510,365 B1
(45) Date of Patent: Jan. 21, 2003

(54) CARRIER SYSTEM POSITIONING METHOD

(75) Inventors: Yasuhiko Nishinakayama, Nirasaki (JP); Shigeru Ishizawa, Yamanashi-Ken (JP); Hiroaki Saeki, Shirane-Machi (JP); Takashi Kawano, Nirasaki (JP); Tetsu Osawa, Sagamihara (JP)

(73) Assignee: Tokyo Electron Limited, Tokyo-To (JP)

( * ) Notice: Subject to any disclaimer, the term of this patent is extended or adjusted under 35 U.S.C. 154(b) by 0 days.

(21) Appl. No.: 09/830,363

(22) PCT Filed: Oct. 26, 1999

(86) PCT No.: PCT/JP99/05914

§ 371 (c)(1), (2), (4) Date: Apr. 25, 2001

(87) PCT Pub. No.: WO00/24551

PCT Pub. Date: May 4, 2000

(30) Foreign Application Priority Data

Oct. 27, 1998 (JP) .......................................... 10-321501

(51) Int. Cl.[7] .............................................. G06F 7/00
(52) U.S. Cl. ........................ 700/214; 700/218; 700/37; 700/250; 700/254; 700/258; 318/568.13; 318/568.21; 414/805; 414/806; 414/936; 901/3; 901/5
(58) Field of Search ................................ 700/213, 214, 700/218, 28, 37, 56, 57, 253, 254, 258, 259, 250, 245; 414/800, 805, 806, 810, 935, 936, 939; 318/568.13, 568.21, 568.14; 901/3, 4, 5

(56) References Cited

U.S. PATENT DOCUMENTS 5,238,354 A * 8/1993 Volovich ..................... 356/400
5,456,561 A * 10/1995 Poduje et al. ............. 414/744.5
5,513,948 A * 5/1996 Bacchi et al. ............... 198/394

(List continued on next page.)

FOREIGN PATENT DOCUMENTS

| JP | 6-69315 | 3/1994 |
| JP | 6-326172 | 11/1994 |
| JP | 8-202421 | 8/1996 |
| JP | 9-252039 | 9/1997 |
| JP | 10-6262 | 1/1998 |

OTHER PUBLICATIONS

English Translation of PCT International Preliminary Examination Report for PCT/JP99/05914, dated Nov. 21, 2000.

*Primary Examiner*—Khoi H. Tran
(74) *Attorney, Agent, or Firm*—Smith, Gambrell & Russell, LLP

(57) ABSTRACT

The invention is a method for positioning a conveying mechanism having a holding portion for semiconductor wafers. Respective provisional position coordinates of an orienting teaching standard position and a container teaching standard positions are inputted into a controlling unit in advance. A wafer to be conveyed precisely positioned with respect to and held by the holding portion is conveyed and placed on the rotating orienting device according a control based on the provisional coordinates of the orienting teaching standard position. A posture detector then detects the eccentric volume and eccentric direction of the wafer. Appropriate position coordinates are made by amending the provisional coordinates. Then, a wafer to be conveyed precisely positioned with respect to the container teaching standard position is conveyed and placed on the rotating orienting device according a control based on the provisional coordinates of the orienting teaching standard position. A posture detector then detects the eccentric volume and eccentric direction of the wafer. Appropriate position coordinates are made by amending the provisional coordinates.

20 Claims, 15 Drawing Sheets

U.S. PATENT DOCUMENTS

| | | | | |
|---|---|---|---|---|
| 5,535,306 A | * | 7/1996 | Stevens | 700/254 |
| 5,611,655 A | * | 3/1997 | Fukasawa et al. | 414/217 |
| 5,695,562 A | | 12/1997 | Mizosaki | |
| 5,740,034 A | | 4/1998 | Saeki | |
| 5,905,850 A | * | 5/1999 | Kaveh | 198/394 |
| 6,085,125 A | * | 7/2000 | Genov | 414/226.05 |
| 6,105,454 A | * | 8/2000 | Bacchi et al. | 414/744.5 |
| 6,162,008 A | * | 12/2000 | Perkins et al. | 198/394 |
| 6,270,306 B1 | * | 8/2001 | Otwell et al. | 414/217 |
| 6,313,596 B1 | * | 11/2001 | Wyka et al. | 318/568.16 |

\* cited by examiner

CARRIER SYSTEM POSITIONING METHOD

FIELD OF THE INVENTION

This invention relates to a method for positioning a conveying mechanism for conveying semiconductor wafers or the like, in particular to a method for quickly positioning a conveying system.

BACKGROUND OF THE INVENTION

In general, a system for manufacturing semiconductor devices includes combined various processing chambers. A conveying mechanism is provided between two of the chambers and/or between one of the chambers and a cassette for containing many semiconductor wafers, in order to convey the wafers automatically. The conveying mechanism has a conveying arm that is able to expand, contract, rotate and move vertically. The conveying arm is adapted to move horizontally to a predetermined convey-position in order to convey a wafer to a predetermined position.

In the case, it has to be avoided that the conveying arm interferes or collides with another element while the conveying arm is moving. In addition, the conveying arm has to appropriately receive a wafer that has been placed on a predetermined position, convey the wafer to an objective position and pass the wafer to an appropriate position precisely.

Thus, a "teaching operation" is performed. By the teaching operation, important positions such as a position in a moving path of the conveying arm to pass the wafer can be memorized as position coordinates in a controlling unit such as a computer that controls operations of the conveying arm.

SUMMARY OF THE INVENTION

The teaching operation is performed for almost all of positional relationships involved with receiving and passing of a wafer, such as a positional relationship between the conveying arm and a cassette container, a vertical positional relationship between the arm and the cassette for taking the wafer and a positional relationship between a stage of a load-lock chamber and the arm. Then, respective positional coordinates can be memorized. Each of driving systems incorporates an encoder or the like for determining a driving position thereof.

In detail, at first, a position in a moving path of the conveying arm is set as an absolute standard. Then, position coordinates are calculated from designed values with respect to positions in the entire system for which teaching operations should be performed. The calculated position coordinates are inputted into and memorized in the controlling unit as provisional position coordinates. In the case, the respective provisional position coordinates are inputted allowing for such a predetermined margin that the conveying arm does not collide with another element.

Next, the conveying arm is operated based on the respective provisional position coordinates. When the conveying arm reaches a vicinity of the teaching standard position, a control mode is switched into a manual mode. Then, for example in a state wherein a fork of the conveying arm and the wafer are in contact with each other, an operator performs a manual operation to make a center position of the fork coincide with a center position of the wafer while the operator watches the state from a lateral side with his or her naked eyes. After the centers coincide with each other, the coordinates are memorized in the controlling unit as accurate and appropriate position coordinates. The conventional teaching operation is performed according to the above steps. The teaching operations are performed manually and with operator's naked eyes for each of the teaching standard positions.

In the above conventional positioning method, the conveying arm is delicately positioned by made to rotate, expand and/or contract. Thus, there is a problem that the positioning needs very long time.

In addition, because of personal difference between the operators performing the teaching operations, accuracy of the positioning may be uneven. Furthermore, in a case wherein the fork and/or the arm is repaired or replaced, the above steps of positioning operation by teaching have to be repeated again, which may cause very long time loss.

This invention is intended to solve the above problems. The object of this invention is to provide a method for positioning a conveying system that can precisely and efficiently position a teaching standard position.

The invention is a method for positioning a conveying system including; a conveying arm having: a conveying arm body that is able to contract, expand, rotate and move vertically, and a holding portion provided at a tip portion of the conveying arm body for holding an object to be conveyed, a moving mechanism for causing the conveying arm to move, at least one container stage disposed in a moving area of the holding portion for placing a cassette container that can contain a plurality of objects to be conveyed in a tier-like manner, a direction-position positioning unit having: a rotation standard stage disposed in the moving area of the holding portion, and a position and posture detector for detecting an eccentric volume and an eccentric direction of the object to be conveyed placed on the rotation standard stage, and a controlling unit that can control entire operations, wherein the holding portion is positioned with respect to a standard position, the method comprising; a step of inputting respective provisional position coordinates of an orienter teaching standard position that is a predetermined position on the rotation standard stage and a container teaching standard position that is a predetermined position in the cassette container placed on the container stage, into the controlling unit in advance, a step of conveying and placing an object to be conveyed precisely positioned with respect to and held by the holding portion onto the rotation standard stage, according to a control based on the provisional position coordinates of the orienter teaching standard position, a step of detecting an eccentric volume and an eccentric direction of the object to be conveyed placed on the rotation standard stage by the position and posture detector, a step of making appropriate position coordinates by amending the provisional position coordinates of the orienter teaching standard position based on the detected eccentric volume and the detected eccentric direction, a step of conveying and placing an object to be conveyed precisely positioned with respect to the container teaching standard position onto the rotation standard stage, according to a control based on the provisional position coordinates of the container teaching standard position, a step of detecting an eccentric volume and an eccentric direction of the object to be conveyed placed on the rotation standard stage by the position and posture detector, and a step of making appropriate position coordinates by amending the provisional position coordinates of the container teaching standard position based on the detected eccentric volume and the detected eccentric direction.

According to the feature, correct appropriate position coordinates can be obtained, by conveying an object to be conveyed manually precisely positioned with respect to and held by the holding portion of the conveying arm to the direction-position positioning unit or by taking an object to be conveyed manually precisely positioned with respect to each of the teaching standard positions by the conveying arm and conveying the object to the direction-position positioning unit by the conveying arm, and by detecting an eccentric volume and an eccentric direction of the object.

In a real operation, the controlling unit causes the conveying arm to move based on the appropriate position coordinates. Thus, the conveying arm can be positioned quickly and precisely without consuming long time like a conventional positioning. In addition, there is no personal difference in the positioning operation, that is, precise positioning can be always achieved not dependently on ability of the operator.

It is preferable that: the moving mechanism has a guide rail on which the conveying arm can slide, and the provisional position coordinates include an X-coordinate along the guide rail, an R-coordinate being a contraction or expansion volume of the conveying arm body, a θ-coordinate being a rotation volume of the conveying arm body and a Z-coordinate being a vertical movement volume of the conveying arm body.

Preferably, a load-lock chamber in which a vacuum can be formed is arranged in the moving area of the holding portion, the load-lock chamber having therein a object-to-be-conveyed stage for placing the object to be conveyed, and the method further comprises: a step of inputting provisional position coordinates of a load-lock teaching standard position that is a predetermined position on the object-to-be-conveyed stage, into the controlling unit in advance, a step of conveying and placing an object to be conveyed precisely positioned with respect to the load-lock teaching standard position onto the rotation standard stage, according to a control based on the provisional position coordinates of the load-lock teaching standard position, a step of detecting an eccentric volume and an eccentric direction of the object to be conveyed placed on the rotation standard stage by the position and posture detector, and a step of making appropriate position coordinates by amending the provisional position coordinates of the load-lock teaching standard position based on the detected eccentric volume and the detected eccentric direction.

According to the feature, precise positioning can be achieved with respect to the load-lock teaching standard position of the load-lock chamber.

Preferably, the load-lock chamber is connected to a transferring chamber, the transferring chamber is connected to a processing chamber having therein a susceptor for placing the object to be conveyed, the transferring chamber has a transferring arm having: a transferring arm body that is able to contract, expand and rotate, and a second holding portion provided at a tip portion of the transferring arm body for holding an object to be conveyed, a nick is formed at a peripheral portion of the object to be conveyed, the position and posture detector can detect a position of the nick of the object to be conveyed, and the method further comprises: a step of inputting provisional position coordinates of a susceptor teaching standard position that is a predetermined position on the susceptor, into the controlling unit in advance, a step of conveying and placing an object to be conveyed precisely positioned with respect to the susceptor teaching standard position to the load-lock chamber by the transferring arm, according to a control based on the provisional position coordinates of the susceptor teaching standard position, a step of conveying and placing the object to be conveyed placed in the load-lock chamber onto the rotation standard stage by the conveying arm, a step of detecting an eccentric volume, an eccentric direction and a position of the nick of the object to be conveyed placed on the rotation standard stage by the position and posture detector, a step of making appropriate position coordinates by amending the provisional position coordinates of the susceptor teaching standard position of the transferring arm based on the detected eccentric volume and the detected eccentric direction, and a step of causing the controlling unit to memorize the detected position of the nick as a positioning direction of the direction-position positioning unit.

According to the feature, the transferring arm can be precisely positioned with respect to the susceptor teaching standard position of the processing chamber.

In the case, preferably, the number of the provided load-lock chambers is two, and the object-to-be-conveyed stage is arranged in each of the two load-lock chambers.

According to the feature, a conveying system that may convey the object to be conveyed through either one of the two load-lock chambers can be precisely positioned.

Alternatively, the processing chamber may be connected to the load-lock chamber without providing the transferring chamber.

In the case, the load-lock chamber is provided as a pair with the processing chamber, and the object-to-be-conveyed stage is arranged in each of the load-lock chambers.

In addition, preferably, the conveying arm has a mapping arm that can take map information of the object or objects to be conveyed in the cassette container, the mapping arm being horizontal to the conveying arm body, a light-emitting unit that can emit a level-detecting light in a horizontal direction is arranged in the moving area of the holding portion, a light-receiving unit that can receive the level-detecting light emitted from the light-emitting unit is arranged, and the method further comprises: a step of causing the conveying arm to relatively vertically move in a vicinity of the light-emitting unit by using the level-detecting light emitted from the light-emitting unit in the horizontal direction as a standard, and calculating distance information between the conveying arm body and the mapping arm, a step of taking the map information for each of cassette containers, and a step of making appropriate position coordinates by amending the provisional position coordinates about the X-coordinate, based on the distance information and the map information.

According to the feature, more appropriate position coordinates, whose Z-coordinate also has been amended, can be obtained.

In addition, preferably, the method further comprises after the step of inputting the respective provisional position coordinates: a step of roughly positioning the respective teaching standard positions, and a step of setting position coordinates obtained by roughly positioning as new provisional position coordinates.

According to the feature, the provisional position coordinates set based on designed values can be replaced with relatively more accurate position coordinates obtained by being roughly positioned. However, the roughly positioning operation is unnecessary when the provisional position coordinates set based on the designed values are accurate to some extent.

Furthermore, preferably, the method further comprises: a step of conveying and placing an object to be conveyed precisely positioned with respect to and held by the holding portion onto the rotation standard stage, after the holding portion or the conveying arm body has been repaired or replaced, a step of detecting an eccentric volume and an eccentric direction of the object to be conveyed placed on the rotation standard stage by the position and posture detector, and a step of making new appropriate position coordinates by amending R-coordinates and θ-coordinates of all the appropriate position coordinates of the conveying arm, based on the detected eccentric volume and the detected eccentric direction.

According to the feature, in a case wherein the holding portion or the conveying arm body has been repaired or replaced, amendment of an R-coordinate and a θ-coordinate of a teaching standard position can be used for all the teaching standard positions of the conveying arm. Thus, all the appropriate position coordinates can be simply and quickly amended regarding the R-coordinate and the θ-coordinate of the conveying arm, to make new appropriate position coordinates.

Alternatively, the method further comprises: a step of conveying and placing an object to be conveyed precisely positioned with respect to and held by the holding portion onto the rotation standard stage, after the holding portion or the conveying arm body has been repaired or replaced, step of detecting an eccentric volume and an eccentric direction of the object to be conveyed placed on the rotation standard stage by the position and posture detector, and a step of making new appropriate position coordinates by amending X-coordinates and R-coordinates of all the appropriate position coordinates of the conveying arm, based on the detected eccentric volume and the detected eccentric direction.

According to the feature, in a case wherein the holding portion or the conveying arm body has been repaired or replaced, amendment of an X-coordinate and an R-coordinate of a teaching standard position can be used for all the teaching standard positions of the conveying arm. Thus, all the appropriate position coordinates can be simply and quickly amended regarding the X-coordinate and the R-coordinate of the conveying arm, to make new appropriate position coordinates.

Furthermore, preferably, the method further comprises: a step of causing the conveying arm to relatively vertically move by using a level-detecting light emitted in a horizontal direction as a standard, and calculating distance information between the conveying arm body and a mapping arm, after the holding portion or the conveying arm body has been repaired or replaced, a step of taking map information for each of cassette containers, and a step of making appropriate position coordinates by amending Z-coordinates of all the appropriate position coordinates of the conveying arm, based on the distance information and the map information.

According to the feature, in a case wherein the holding portion or the conveying arm body has been repaired or replaced, all the appropriate position coordinates can be simply and quickly amended regarding the Z-coordinate, to make new appropriate position coordinates.

Furthermore, preferably, the method further comprises: a step of conveying and placing an object to be conveyed precisely positioned with respect to and placed on the second holding portion to the load-lock chamber by the transferring arm, after the second holding portion or the transferring arm body has been repaired or replaced, a step of conveying and placing the object to be conveyed placed in the load-lock chamber onto the rotation standard stage by the conveying arm, a step of detecting an eccentric volume and an eccentric direction of the object to be conveyed placed on the rotation standard stage by the position and posture detector, and a step of making new appropriate position coordinates by amending all the appropriate position coordinates of the transferring arm, based on the detected eccentric volume and the detected eccentric direction.

According to the feature, in a case wherein the second holding portion or the transferring arm body has been repaired or replaced, amendment of an R-coordinate and a θ-coordinate of a teaching standard position can be used for all the teaching standard positions of the transferring arm. Thus, all the appropriate position coordinates can be simply and quickly amended regarding the X-coordinate and the R-coordinate of the transferring arm, to make new appropriate position coordinates.

Furthermore, preferably, during an operation of the conveying system after the appropriate position coordinates has been made, the conveying system is adapted to detect a positional deviation of the holding portion that is generated during the operation, by calculating coordinates of a special portion of the conveying arm at any time by using the position and posture detector of the direction-position positioning unit or a level detecting unit in the moving area.

According to the feature, during a usual operation, it is easy to detect how much positional deviation of the conveying arm is generated. In the case, the special portion of the conveying arm may be a light-penetrable window formed at the conveying arm, or may be a special edge portion of the conveying arm.

In addition, one conveying arm can have two conveying arm bodies and two holding portions, which can be operated independently. In the case too, the above invention can be applied. In addition, one transferring arm can have two transferring arm bodies and two second holding portions, which can be operated independently. In the case too, the above invention can be applied.

Furthermore, preferably, the method further comprises: a step of conveying and placing an object to be conveyed precisely positioned with respect to and held by the holding portion onto the rotation standard stage, according to a control based on the appropriate position coordinates of the orienter teaching standard position, a step of detecting an eccentric volume and an eccentric direction of the object to be conveyed placed on the rotation standard stage by the position and posture detector, and a step of confirming the appropriate position coordinates of the orienter teaching standard position based on the detected eccentric volume and the detected eccentric direction.

Furthermore, preferably, the method further comprises: a step of conveying and placing an object to be conveyed precisely positioned with respect to each of the respective teaching standard positions onto the rotation standard stage, according to a control based on the appropriate position coordinates of each of the teaching standard positions, a step of detecting an eccentric volume and an eccentric direction of the object to be conveyed placed on the rotation standard stage by the position and posture detector, and a step of confirming the appropriate position coordinates of each of the teaching standard positions based on the detected eccentric volume and the detected eccentric direction.

DESCRIPTION OF THE PREFERRED EMBODIMENT

An embodiment of a method for positioning a conveying system according to the invention will now be described in more detail with reference to accompanied drawings.

Figure 1:
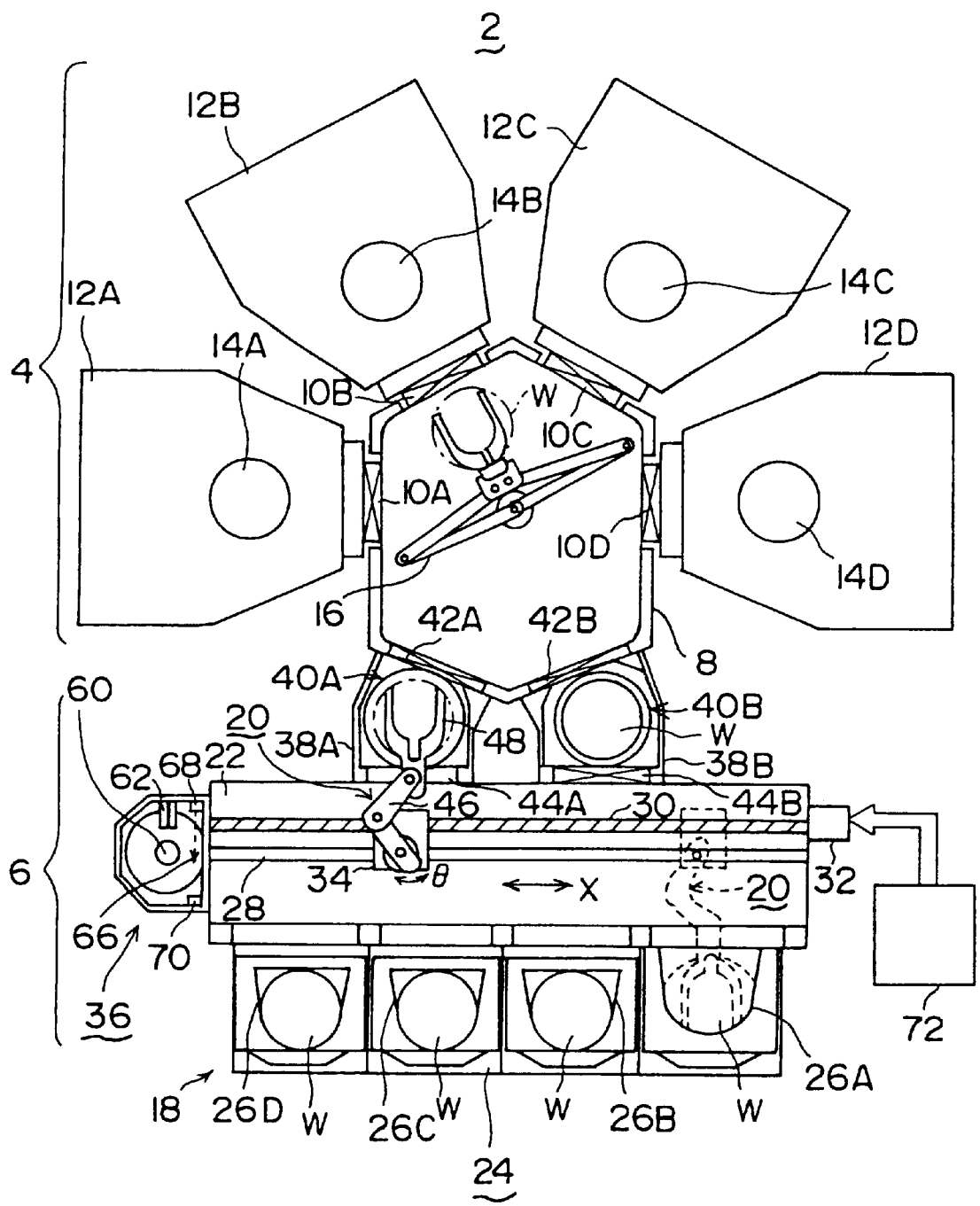
FIG. 1 is a schematic view of a cluster-tool unit used for conducting a method according to the invention.

At first, with reference to FIG. 1, a cluster-tool unit is explained. The cluster-tool unit 2 mainly consists of a processing system 4 that can conduct various processes such as a film-forming process, a diffusing process, an etching process or the like to a semiconductor wafer W as an object to be conveyed, and a conveying system 6 that can convey the wafer W into and out of the processing system 4.

The processing system 4 consists of a transferring chamber 8 in which a vacuum can be formed and four processing chambers 12A–12D connected to the transferring chamber 8 via respective gate valves 10A–10D. The respective chambers 12A–12D can conduct the same kind of thermal process or different kinds of thermal processes to the wafer W. A susceptor 14A–14D is provided in each of the chambers 12A–12D in order to place the wafer W thereon. A transferring arm 16 that can contract, expand and rotate is provided in the transferring chamber 8. The transferring arm 16 is adapted to pass (move) the wafer W between any two of the respective chambers 12A–12D and load-lock chambers 38A and 38B described below.

The transferring system 6 has a cassette stage 18 on which a cassette container is placed, and a conveying stage 22 that can cause the conveying arm 20 to move in order to convey and pass the wafer W. The cassette stage 18 has a container stage 24 on which a plurality of (four in the shown example) cassette containers 26A–26D can be placed. Each of the cassette containers 26A–26D can contain for example 25 or less wafers W in a tier-like manner by the same pitch (see FIG. 4).

The transferring stage 22 has a guide rail 28 extending in a longitudinal direction in a center portion thereof. The conveying arm 20 is supported by the guide rail 28 in a slidable manner. In detail, a moving mechanism such as a ball-screw 30 is arranged in a parallel with the guide rail 28. A base portion 34 of the conveying arm 20 is fitted into the ball-screw 30. Thus, when a driving motor 32 that is provided at an end portion of the ball-screw 30 operates and rotates, the conveying arm 20 moves along the guide rail 28.

An orienter 36 is provided at the other end portion of the transferring stage 22 as a direction-position positioning unit that can conduct a positioning of the wafer. In addition, two load-lock chambers 38A and 38B in each of which a vacuum can be formed are connected between a midway portion of the transferring stage 22 and the transferring chamber 8. Each of the load-lock chambers 38A and 38B has a object-to-be-conveyed stage 40A, 40B on which the wafer W can be placed. Each of the load-lock chambers 38A and 38B has a gate valve 42A, 42B at a side of the transferring chamber 8, and a gate valve 44A, 44B at a side of the transferring stage 22.

Figure 2:
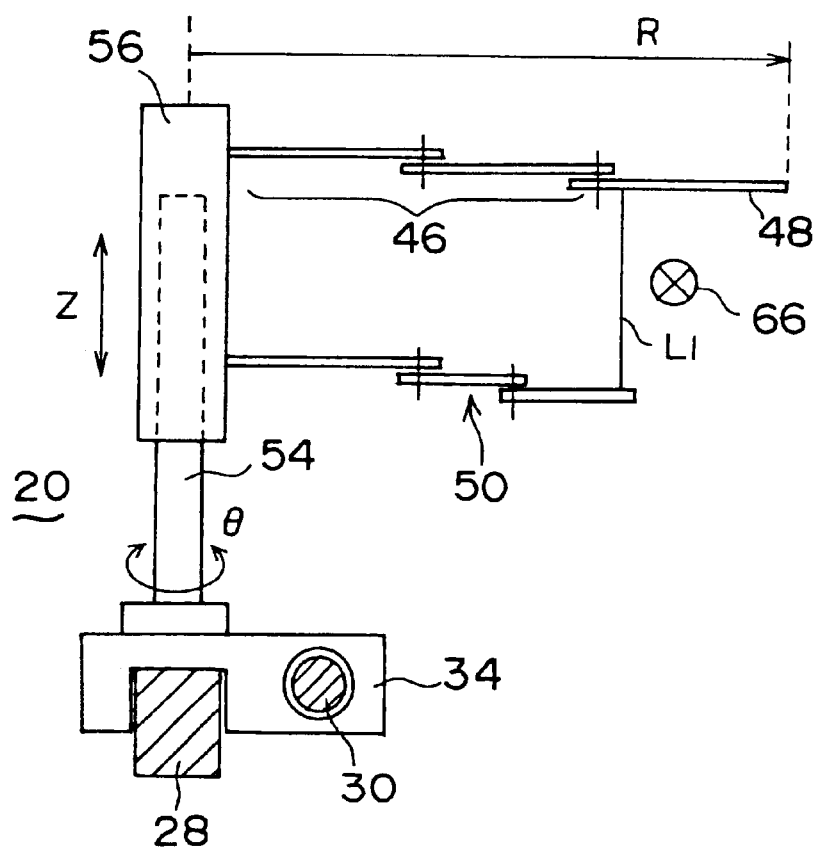
FIG. 2 is a schematic view of a conveying arm.
Figure 3:
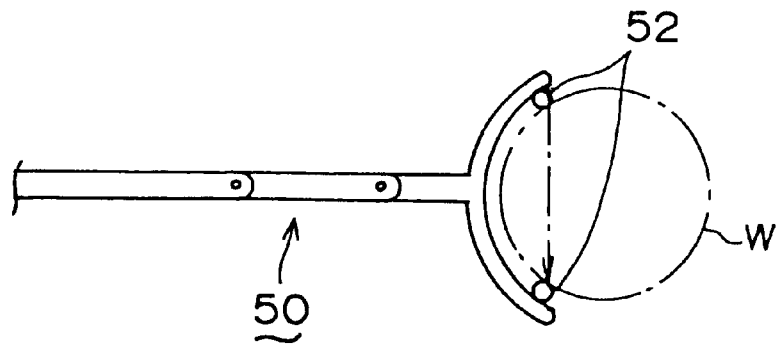
FIG. 3 is a plan view of a mapping arm.
Figure 4:
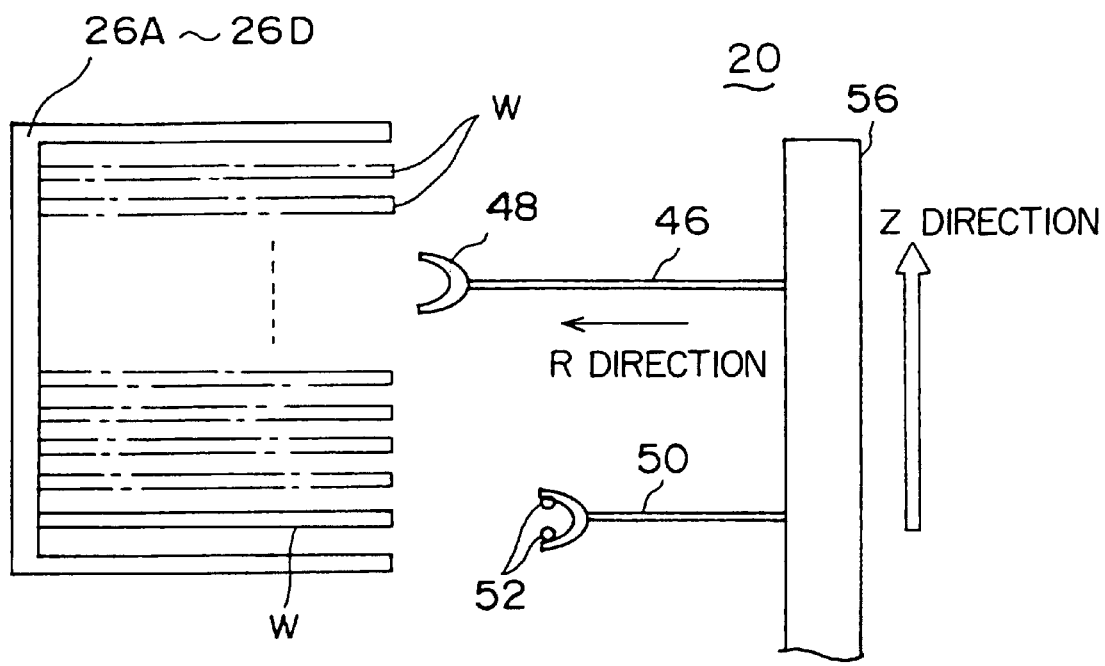
FIG. 4 is an explanatory view of a mapping operation.

As shown in FIGS. 2 to 4, the conveying arm 20 has a multi-joint-like conveying arm body 46 that can contract and expand, and a fork 48 (holding portion) attached to a tip portion of the conveying arm body 46.

The wafer W is adapted to be held directly on the fork 48. In addition, the conveying arm 20 has a mapping arm 50 that can similarly contract and expand. As shown in FIG. 3, a tip portion of the mapping arm 50 is formed into an arc shape. A mapping sensor 52 that can confirm whether there is a wafer W for example by using emission and receiving of a laser beam is attached on the tip portion. Respective base portions of the conveying arm body 46 and the mapping arm 50 are joined to a vertical-moving stage 56 that can vertically move along a pillar 54 standing from the base portion 34. The pillar 54 is able to rotate. Thus, a mapping operation for obtaining a position of the wafer W contained in the cassette container is performed by raising or lowering the mapping arm 50 in its extended state as shown in FIG. 3. Thus, the position of the waver can be obtained and confirmed. Herein, a description of a driving mechanism for performing the above serial operations is omitted. In addition, FIG. 2 shows a schematic movement of the conveying arm 20, but does not show an actual structure.

Herein, a direction along the guide rail 28 is defined as an X-direction, a vertical movement of the vertical-moving stage 56 is defined as an Z-direction, a rotational direction of the pillar 54 or the vertical-moving stage 56 is defined as an θ-direction, and a longitudinal direction including the fork 48 and the conveying arm body 46 is defined as an R-direction. Thus, all positional states of the conveying arm 20 can be represented by using X, Z, R and θ coordinates. Regarding the respective coordinates, of course, shift volumes from predetermined standard positions can be obtained by encoders or the like.

Figure 5:
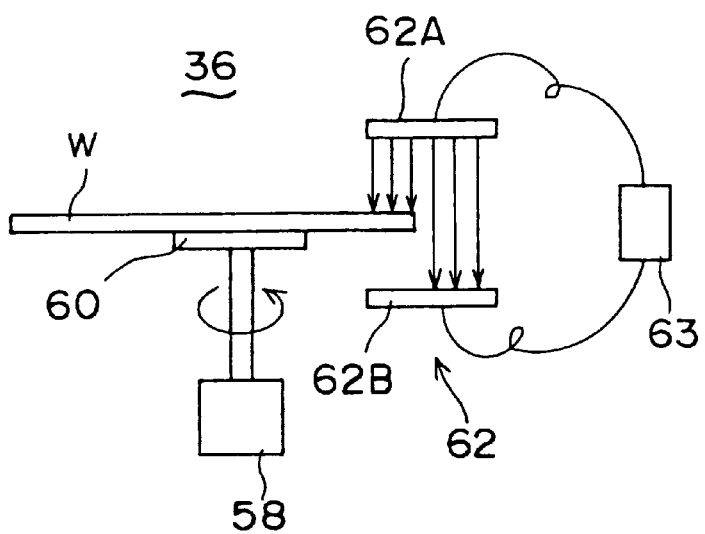
FIG. 5 is a side view showing a direction-position positioning unit.
Figure 6:
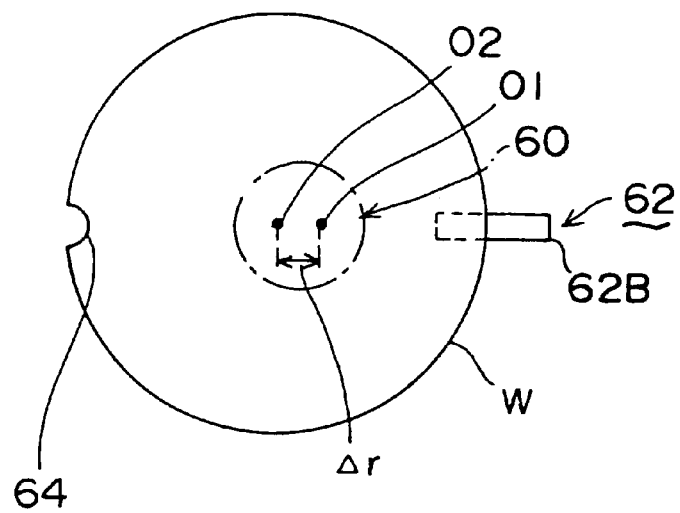
FIG. 6 is a plan view showing a state wherein an object to be conveyed is placed on the direction-position positioning unit.
Figure 7:
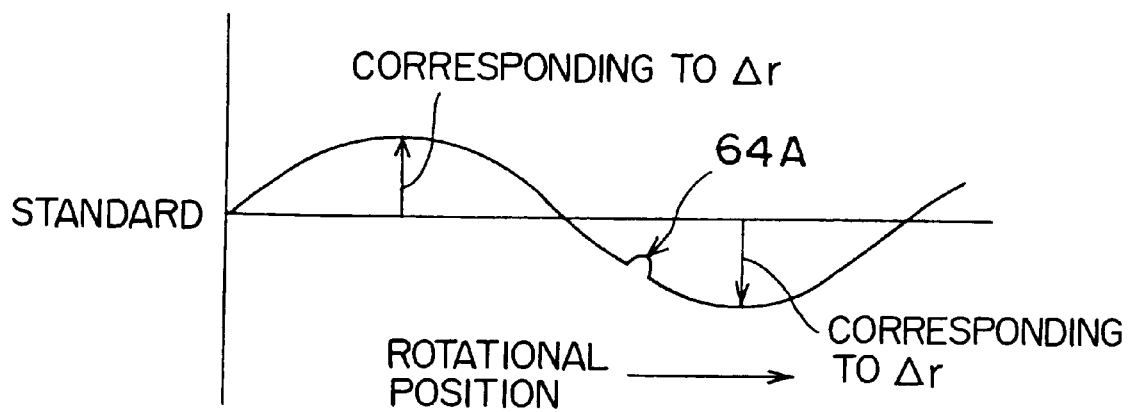
FIG. 7 is a view showing an example of a detected waveform in the direction-position positioning unit.

As shown in FIGS. 5 and 6, the orienter 36 has a rotation standard stage 60 that is driven to rotate by a driving motor 58. The rotation standard stage 60 can rotate in a state wherein the wafer W is placed thereon. An optical sensor 62 is provided at a peripheral portion of the rotation standard stage 60 in order to detect a peripheral portion of the wafer W. The optical sensor 62 consists of a light-emitting device 62A having a certain length arranged in a radial direction of the rotation standard stage 60 and a light-receiving device 62B. The light-emitting device 62A emits a curtain-like laser beam to a peripheral portion of the wafer. The position of the wafer W can be detected by detecting the laser beam by the light-receiving device 62B. Then, a detecting-processing unit 63 is adapted to obtain an eccentric (decentering) volume and an eccentric direction of the wafer W as well as a rotational position i.e. an orientation of a nick such as a notch 64 formed at the wafer W, by using a detected waveform as shown in FIG. 7.

In FIG. 6, O1 represents a center (rotational center) of the rotation standard stage 60, and O2 represents a center of the wafer W. Thus, the eccentric volume is Δr. At that time, the detected waveform as shown in FIG. 7 is a sine-curve having an amplitude corresponding to the Δr. The eccentric direction can be obtained from a rotational position corresponding to a maximum amplitude. A signal 64A appears at a portion corresponding to the notch 64. The signal 64A shows the rotational position of the notch 64. Thus, rotational positional deviation from a predetermined standard position to the notch 64 can be detected. Herein, the nick may be the notch 64 in 12-inch wafers, but could be a notch or an orientation flat in 8-inch or 6-inch wafers. If the eccentric volume Δr is zero, the detected waveform is a straight line, except for the potion of the signal 64A.

As shown in FIG. 1, a level-detecting unit 72 is provided at an inlet portion of the orienter 36, the unit 72 consisting of a laser device 68 for emitting a level-detecting laser beam 66 in a horizontal direction and a receiving device 70 for receiving the laser beam 66. Thus, distance information can be obtained by measuring a distance between the mapping arm 50 of the conveying arm 20 and the fork 48. Then, positional information along the respective axes and information obtained by the respective detecting units are gathered into the controlling unit 72 (see FIG. 1) that can control entire operations of the cluster-tool unit 2. The controlling unit 72 conducts a conveying control of the wafer W, based on the information. In addition, the controlling unit 72 memorizes position coordinates or the like necessary for position teaching operations, which is described below.

Then, a positioning method according to the invention performed by using the above cluster-tool unit 2 is explained.

Herein, a positioning operation for the conveying arm 20 in the conveying system 6 is mainly explained, and a positioning operation for the transferring arm 16 in the processing system 4 may be performed.

At first, points that should be positioned are mainly points where the conveying arm 20 passes or receives the wafer W. During the conveying operation, the conveying arm 20 should be precisely positioned at respective predetermined positions, and respective postures of the fork and the arm body should be fixed in order to pass or receive the wafer in an appropriate orientation state.

The conveying arm 20 has three axes of X, R and θ as movable directions in a two-dimensional plane. Thus, if no axis is fixed, the posture of the conveying arm 20 can not be fixed with respect to special coordinates. Thus, herein, the X-axis is fixed. Even if the X-axis is fixed, any point in a stroke range of the arm can be specified by changing R and θ. Herein, a point PO (see FIG. 8) on the guide rail 28 is set as a standard point for absolute coordinates. Position coordinates for respective teaching operations are specified with respect to the point PO. In the point PO, the conveying arm 20 is located on an origin point of the X-axis. The θ-axis is in an extending direction of the guide rail 28. The Z-axis is through a lowermost point. The R-axis's origin point is a most contracted posture.

Figure 8:
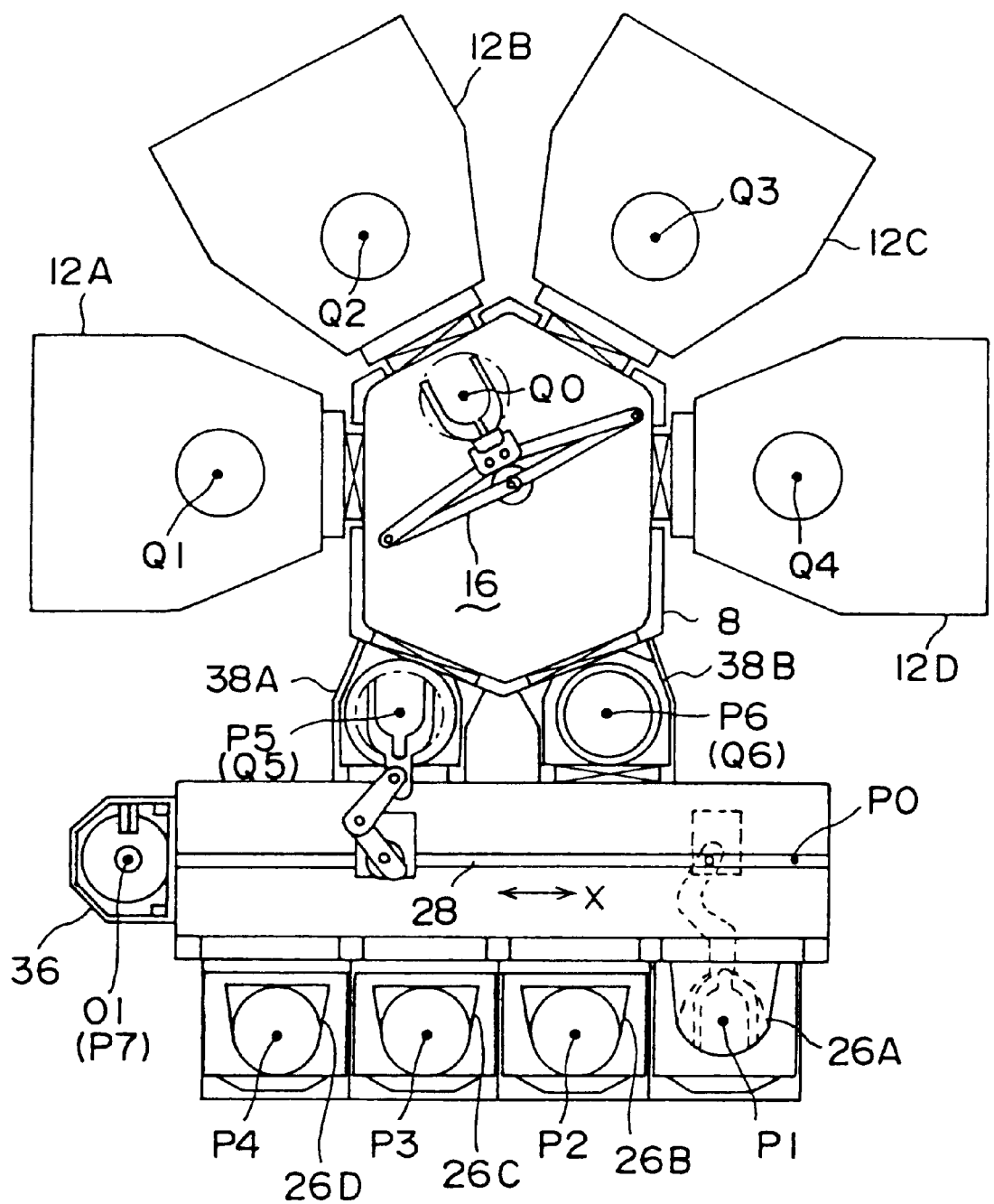
FIG. 8 is a view showing respective teaching standard positions.

Then, a position to which the wafer should be conveyed or another position is set as a teaching standard position. For example, herein, as shown in FIG. 8, points P1–P7 and Q1–Q6 are set as teaching standard positions in advance. The points P1–P4 are container teaching standard positions corresponding to respective transfer-positions for the respective cassette containers 26A–26D. The points P5 and P6 are load-lock teaching standard positions corresponding to respective transfer-positions for the respective load-lock chambers 38A and 38B. The point P7 is an orienter teaching standard position corresponding to a transfer-position for the orienter 36, and located on the O1.

On the other hand, a point Q0 in the processing system 4 corresponds to a standard point for absolute coordinates of the transferring arm 16. The points Q1–Q4 are susceptor teaching standard positions corresponding to respective transfer-positions for the respective susceptors 14A–14D of the respective processing chambers 12A–12D. The points Q5 and Q6 being further susceptor teaching standard positions correspond to the load-lock teaching standard positions P5 and P6 that correspond to respective transfer-positions for the load-lock chambers 38A and 38B, respectively.

Steps for the positioning are schematically explained. At first, for example in the point PO, a wafer W is placed on the fork 48 in such a manner that the center of the fork 48 and the center of the wafer W coincide with each other very precisely. Then, the wafer W is conveyed to the orienter 36, and the wafer W is placed on the rotation standard stage 60 in such a manner that the center of the wafer W is located at the orienter teaching standard position, according to a control using provisional position coordinates. An eccentric volume Δr (see FIG. 6) and an eccentric direction of the wafer W at that time can be obtained by causing the rotation standard stage 60 to rotate. Then, the provisional position coordinates are amended (only regarding R and θ) oppositely to the eccentric direction by the eccentric volume Δr, in order to make appropriate position coordinates. If the provisional position coordinates are inaccurate, the inaccuracy appears as the eccentric volume Δr. Thus, if the provisional position coordinates are amended correspondingly to the eccentric volume Δr, correct appropriate position coordinates can be obtained.

Then, in each of the teaching standard positions, the wafer W is set in such a manner that each of the teaching standard positions and the center of the wafer W coincide with each other very precisely. In addition, if necessary, a rotational position (an orientation) of the notch 64 is adjusted to coincide with a standard direction precisely. Then, the wafer W is taken from each of the teaching standard positions according to a control using the provisional position coordinates, conveyed to the orienter 36 and placed onto the rotation standard stage 60. Then, an eccentric volume Δr and an eccentric direction of the wafer W as well as a rotational position (orientation) of the notch 64 at that time can be obtained by causing the rotation standard stage 60 to rotate. Then, the provisional position coordinates are amended (only regarding R and θ) in the eccentric direction by the eccentric volume Δr, in order to make appropriate position coordinates. The rotational position (orientation) of the notch 64 is memorized in the controlling unit 72. The direction is used as a positioning direction for the notch 64 during usual operations. Regarding the Z-axis, there is only a vertical movement of the fork for example when the wafer W is placed thereon. Thus, except for operations with respect to the cassette containers, it is unnecessary for the vertical movement to be precisely controlled. The operations with respect to the cassette containers are explained below as a mapping operation.

Figure 9:
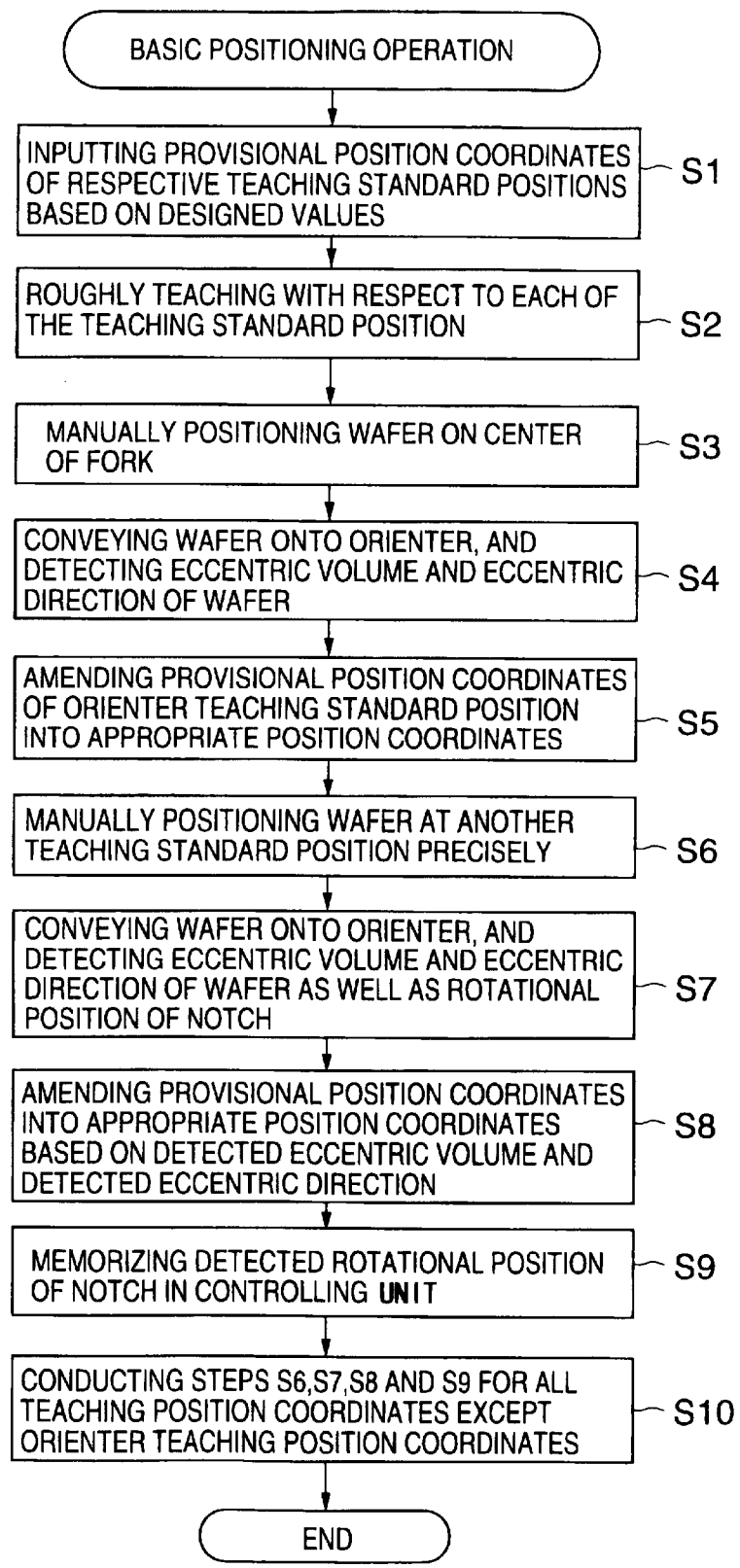
FIG. 9 is a flowchart showing a basic positioning operation.

With reference to a flowchart shown in FIG. 9, a basic positioning operation is explained. Herein, mechanical adjustment such as horizontal adjustment, vertical adjustment or the like has been completed in advance.

At first, based on designed values of the cluster-tool unit 2, provisional position coordinates of respective teaching standard positions P1–P7 are inputted (S1). Then, the conveying arm 20 is caused to move and manually roughly positioned to each of the teaching standard position. The roughly positioned coordinates are memorized, that is, a roughly teaching operation is conducted (S2). The provisional position coordinates are replaced with the above coordinates, which become new provisional position coordinates. Herein, the step S2 is unnecessary if the provisional position coordinates based on the designed values are accurate to some extent.

Then, the wafer W is manually positioned and placed on the center of the fork 48 very precisely (S3). Then, the wafer W is conveyed onto the orienter 36, and an eccentric volume and an eccentric direction of the wafer Ware detected (S4). Then, based on the detected eccentric volume and the detected eccentric direction, the provisional position coordinates of the orienter teaching standard position P7 are amended into the appropriate position coordinates (S5).

Then, the wafer W is manually positioned and set at another teaching standard position precisely (S6). Then, the wafer W is conveyed onto the orienter 36, and an eccentric volume and an eccentric direction of the wafer W as well as a rotational position of the notch 64 are detected (S7). Then, based on the detected eccentric volume and the detected eccentric direction, the provisional position coordinates are amended into the appropriate position coordinates (S8). Then, the controlling unit 72 memorizes the detected rotational position of the notch as a positioning direction for the notch (S9). Then, the above steps S6, S7, S8 and S9 are conducted similarly for all the teaching position coordinates except the orienter position coordinates. Thus, the positioning operation is completed. The teaching position coordinates Q1–Q6 are described below.

Figure 10:
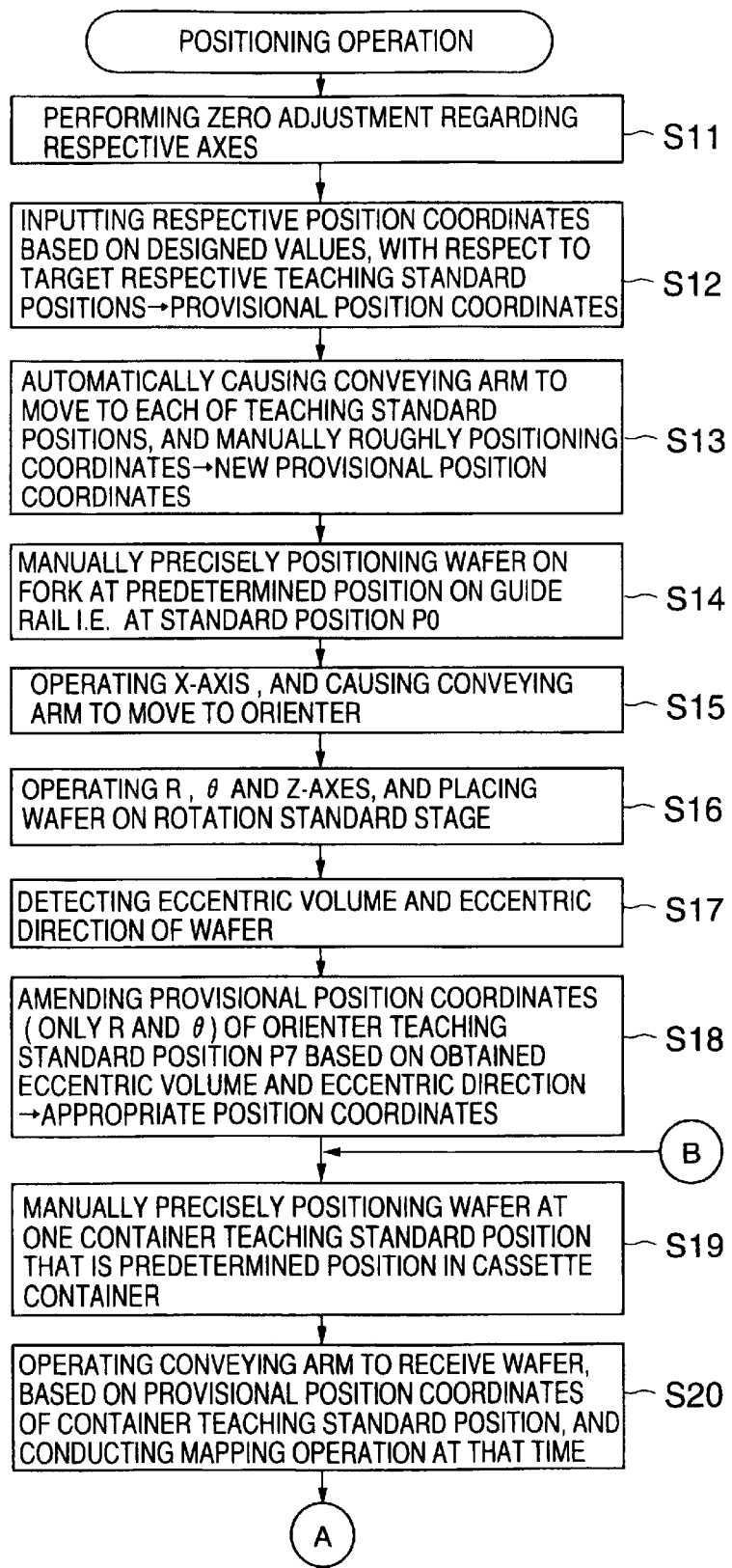
FIG. 10 is a flowchart showing a positioning operation.
Figure 11:
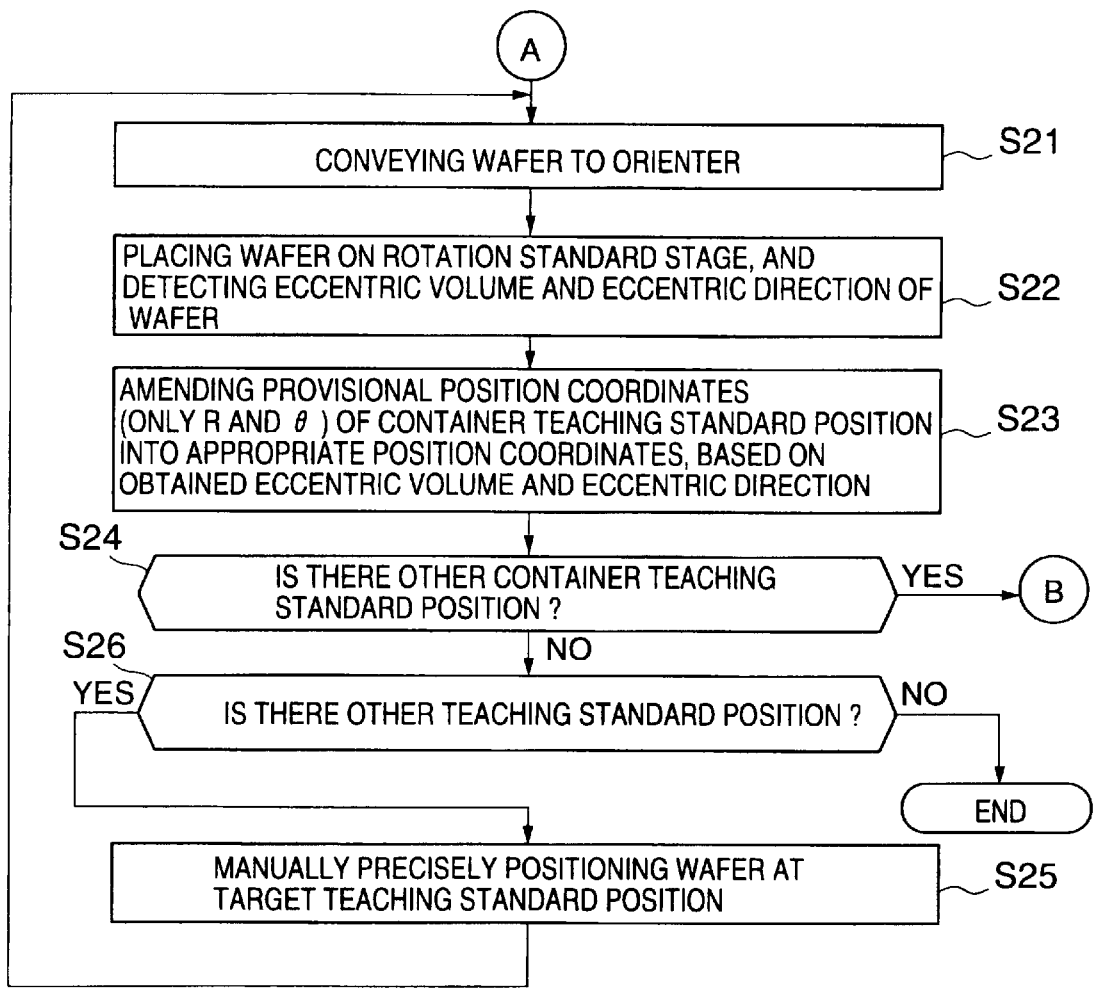
FIG. 11 is a flowchart showing a positioning operation.

Then, the above positioning operation is explained in more detail, with reference to FIGS. 10 and 11.

At first, regarding the respective axes X, R, $\theta$ and Z, zero adjustment is performed (S11). Then, with respect to the target respective teaching standard positions P1–P7 and Q1–Q6, respective position coordinates based on the designed values of the cluster-tool unit 2 are inputted into the controlling unit 72. The inputted position coordinates are set as the provisional position coordinates (S12).

Then, the conveying arm 20 is automatically caused to move to each of the teaching standard positions. Then, a control mode is switched into a manual control mode, postures of the arm 46 and the fork 48 are adjusted manually, and position coordinates at that time are memorized into the controlling unit 72. That is, roughly positioned coordinates are set as new provisional position coordinates (S13).

Regarding the teaching standard positions Q1–Q6, respective operations are conducted not to the conveying arm 20 but to the transferring arm 16. The step S13 needs not to be carried out if the initial provisional position coordinates based on the designed values are accurate.

Then, the conveying arm 20 is automatically caused to move to a predetermined position on the guide rail 28, for example to the standard point PO. Then, after the arm body 46, the fork 48 and so on are set in respective basic postures thereof, a wafer is manually precisely positioned and placed onto the fork 48 (S14). At that time, the center of the wafer W is positioned to coincide with the center of the fork 48 very precisely. In the case, if necessary, a suitable jig may be used. In addition, an orientation of the notch 64 is free.

Then, the X-axis is moved, that is, the conveying arm 20 holding the wafer W is conveyed to the orienter 36 (S15). Then, by operating the R, $\theta$ and Z-axes, the wafer W is placed on the rotation standard stage 60 at the orienter 36 (S16).

Then, as shown in FIGS. 5 and 7, the wafer W is caused to rotate, so that an eccentric volume $\Delta r$ and an eccentric direction of the wafer W are detected by using an optical sensor 62 and a detecting-processing unit 64 (S17). In the case, if the provisional position coordinates of the orienter teaching standard position P7 are accurate very much, the eccentric volume $\Delta r$ is zero. However, if the provisional position coordinates are inaccurate, the inaccuracy appears as the eccentric volume $\Delta r$.

Then, based on the obtained eccentric volume $\Delta r$ and eccentric direction, the provisional position coordinates of the orienter teaching standard position P7 are amended into the appropriate position coordinates (S18). In the case, the X-coordinate remains fixed, that is, the amendment is carried out only regarding the R-coordinate and the $\theta$-coordinate. That is, regarding the X-coordinate, the X-coordinate of the provisional position coordinates is the appropriate position coordinate. The above point is the same for other positioning operations described below.

According to the above operation, the positioning of the orienter teaching standard position P7 is completed.

Then, a positioning operation of the container teaching standard position is conducted.

At first, for example, a wafer W is manually very precisely positioned and set at one container teaching standard position P1 that is a predetermined position in the cassette container 26A (S19). In the case, for example, a lowest first slot of twenty-five slots of the cassette container 26A is defined as a predetermined position, at which the wafer W is positioned very precisely and set. FIG. 4 shows a state wherein the wafer W is set at the lowest first slot. At that time, a center of the wafer W is positioned to coincide with a center of the slot very precisely. In the case too, if necessary, a suitable jig may be used. In addition, an orientation of the notch 64 is free.

Then, under a control by the controlling unit 72, the conveying arm 20 is operated to move to the container teaching standard position P1 in order to receive the wafer W, based on the provisional position coordinates. At that time, a mapping operation described below is conducted, so that the wafer W and the fork 48 may not interfere or collide with each other (S20).

Then, the conveying arm 20 holding the received wafer W is conveyed to the orienter 36 (S21). Then, the wafer W is placed on the rotation standard stage 60 at the orienter 36, and an eccentric volume $\Delta r$ and an eccentric direction of the wafer W are detected similarly to the step S17 (S22). Then, based on the obtained eccentric volume $\Delta r$ and eccentric direction, the provisional position coordinates of the container teaching standard position are amended (only regarding the R-coordinate and the $\theta$-coordinate) into the appropriate position coordinates (S23). Herein, regarding the X-coordinate, the X-coordinate of the provisional position coordinates is the appropriate position coordinate.

Then, regarding the other container teaching standard positions P2, P3 and P4, the above steps S19–S23 are conducted (S24). Then, the positioning operations of the respective teaching standard positions P1–P4 of the respective cassette containers 26A–26D are completed.

Next, if there is another teaching standard position (YES of S26), a wafer W is manually very precisely positioned and set at the target teaching standard position (S25). Then, the steps S21–S23 are conducted similarly, in order to obtain respective appropriate position coordinates. In the case, the wafer W is very precisely positioned and set at each of the object-to-be-conveyed stages 40A and 40B of the respective load-lock chambers 38A and 38B. The wafer W is received by the conveying arm 20, and an eccentric volume Δr and an eccentric direction of the wafer W are detected at the orienter 36. Thus, appropriate position coordinates can be obtained.

After the positioning operations of the load-lock chambers 38A and 38B are completed, positioning operations of the teaching standard positions Q1–Q6 are conducted. In the case, at first, the positioning operations of the load-lock teaching standard positions Q5 and Q6 are conducted. Next, the positioning operations of the susceptor teaching standard positions Q1–Q4 are conducted in any order.

At first, regarding the load-lock teaching standard position Q5, a wafer W is very precisely positioned and set for example at the standard point Q0 of the transferring arm 16. In the case, as described above, a center of the wafer is manually positioned to coincide with the center of the arm precisely. In the case too, an orientation of the notch 64 is free. Then, the wafer W is conveyed and placed onto the object-to-be-conveyed stage 40A in the load-lock chamber 38A. The wafer W is received and conveyed to the orienter 36, by the conveying arm 20 that has been already positioned very precisely with respect to the load-lock chamber 40A. Then, as described above, an eccentric volume Δr and an eccentric direction of the wafer W are detected, so that appropriate position coordinates of the load-lock teaching standard position Q5 can be obtained. The positioning operation of the load-lock teaching standard position Q6 is the same as the above operation.

After the positioning operations of the load-lock teaching standard positions Q5 and Q6 of the transferring arm 16 are completed as described above, a wafer W is manually very precisely positioned and set for example on the susceptor 14A of the processing chamber 12A. In the case too, a center of the wafer W is positioned to coincide with a center of the susceptor 14A precisely. In addition, an orientation of the notch 64 is adjusted to coincide with the standard direction precisely. Then, the wafer W is passed in order of the transferring arm 16, the load-lock chamber 38A and the conveying arm 20. Then, the wafer W is conveyed to the orienter 36, and an eccentric volume and an eccentric direction of the wafer W are detected as described above, so that appropriate position coordinates of the point Q1 can be obtained. In addition, if a rotational position of the notch 64 is detected at the same time, the positioning direction for the notch 64 at the orienter 36 can be obtained. Herein, since the rotational position of the notch 64 is different by through the load-lock chamber 38A or through the load-lock chamber 38B, the above operation has to be conducted for each of the load-lock chambers.

Regarding the other processing chambers 12B–12D, the above operation for the processing chamber 12A is conducted similarly. Thus, respective appropriate position coordinates and respective positioning directions for the notch 64 can be obtained with respect to the respective teaching standard positions Q2–Q4.

Figure 12:
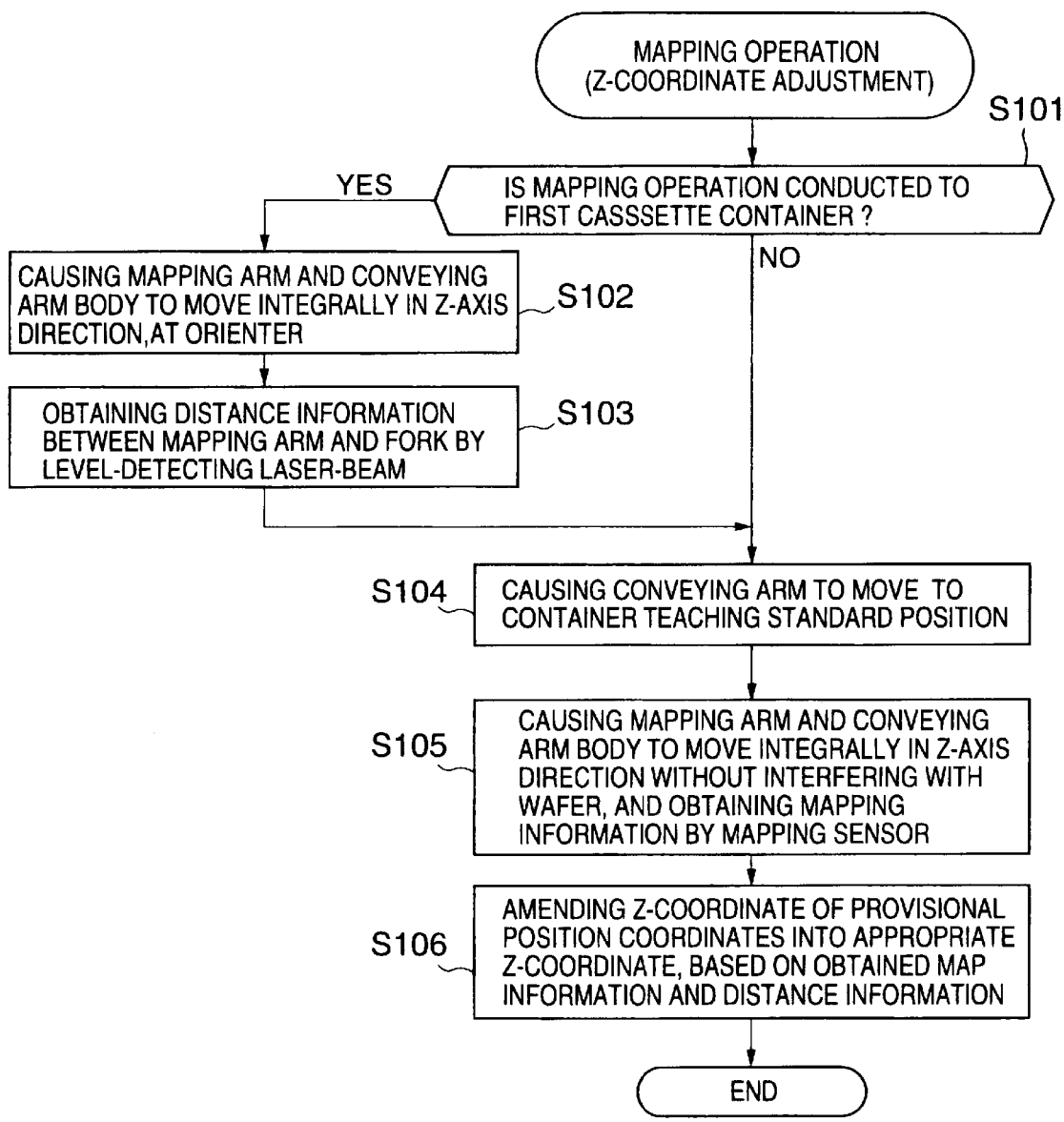
FIG. 12 is a flowchart showing a mapping operation (Z-coordinate adjustment) conducted at a step S20 in FIG. 10.

Next, based on a flowchart shown in FIG. 12, the mapping operation (Z-coordinate adjustment) conducted in the step S20 in FIG. 10 is explained.

Information about a vertical position of the wafer W and a distance L1 between the mapping arm 50 and the fork 48 is necessary in order to avoid a collision between the wafer W and the fork 48 (see FIG. 2). Of course, each slot-pitch of the cassette containers or the like has been already stored in the controlling unit 72 (see FIG. 1).

At first, if the mapping operation is conducted to a first cassette container (YES of S101), the conveying arm 20 is caused to move to the orienter 36, before the conveying arm 20 moves to a position corresponding to the cassette container. Then, the conveying arm body 46 including the mapping arm 50 and the fork 48 is caused to move integrally in the Z-axis direction (upwardly or downwardly) (S102). At that time, the level-detecting light-emitter 68 (see FIG. 1) that is disposed at an entrance of the orienter 36 emits a level-detecting laser beam 66 in a horizontal direction toward the light-receiver 70. The laser-beam 66 is temporarily interrupted by the fork 48 and the mapping arm 50. Thus, the distance L1 between these can be obtained as distance information (S103).

Then, the conveying arm 20 is caused to move to a target container teaching standard position, for example to the position P1 (S104). Then, the mapping arm 50 and the conveying arm body 46 are caused to move integrally in the Z-axis direction (rise or fall) without interfering with the wafer W. At that point, map information can be obtained by a mapping sensor 52 (see FIG. 3) (S105). That is, a position of the wafer W can be recognized. Based on the obtained map information and the distance information, a positional relationship between the fork 48 and the wafer W can be obtained. Based on the obtained relationship, only the Z-coordinate of the provisional position coordinates of the teaching standard position P1 is amended into an appropriate Z-coordinate (S106).

In addition, when the container teaching standard positions P2–P4 of the other cassette containers 26B–26D are positioned, the distance information showing the distance L1 between the mapping arm 50 and the fork 48 has been already obtained. Thus, the steps S102 and S103 in order to measure the distance are not carried out. In the case, the step S104 is conducted to take map information and to obtain respective appropriate position coordinates regarding the Z-coordinate. Such a mapping operation can be applied not only to the container teaching standard positions but also to other teaching standard positions such as the load-lock teaching standard positions.

Thus, all the coordinates of X, R, θ and Z can be replaced with appropriate values. In addition, the appropriate coordinates can be obtained only by precisely positioning a wafer W, differently from the conventional method wherein the posture of the conveying arm 20 or the like has to be adjusted manually precisely. Thus, the conveying arm 20 can be positioned quickly and precisely.

Figure 13:
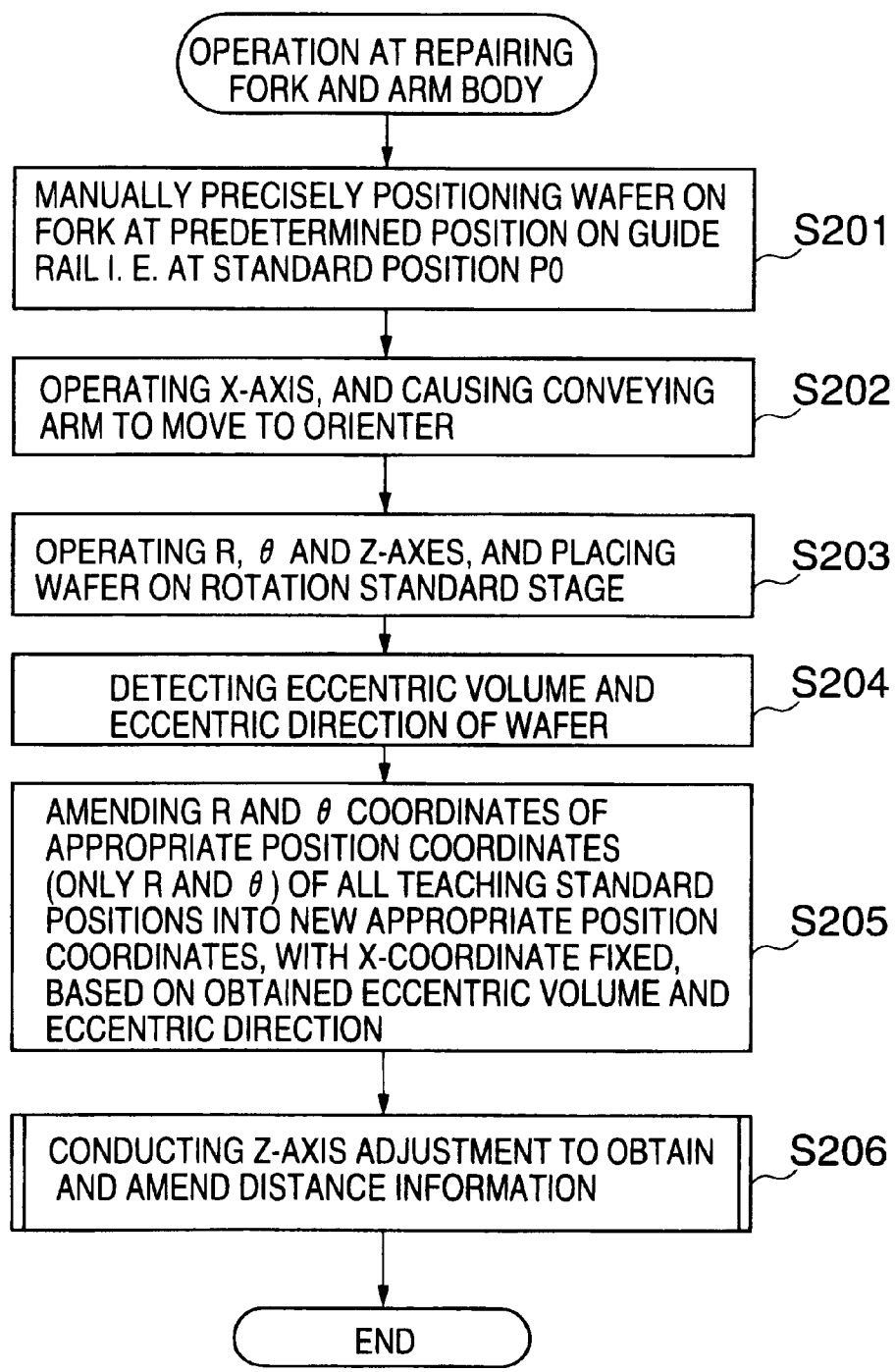
FIG. 13 is a flowchart showing a case wherein the conveying arm has been repaired.

Next, during usual operations, because of any reason, the fork and/or the conveying arm body may be replaced or repaired. Such a case is explained with reference to a flowchart shown in FIG. 13.

In the case, it is possible that the R-coordinate, θ-coordinate and the Z-coordinate except the X-coordinate may shift (deviate) because of the repair or the like of the fork 48 and/or the conveying arm body 46. Thus, the respective coordinates have to be adjusted again.

In the case, at first, the conveying arm 20 is automatically caused to move to a predetermined position on the guide rail 28, for example to the standard point PO. Then, after the arm body 46, the fork 48 and so on are set in respective basic postures thereof, a wafer is manually precisely positioned and placed onto the fork 48 (S201). The step is similar to the step S14 in FIG. 10. At that time, the center of the wafer W is positioned to coincide with the center of the fork 48 very precisely. In the case, if necessary, a suitable jig may be used.

Then, the X-axis is operated, that is, the conveying arm 20 holding the wafer W is conveyed to the orienter 36 (S202). The step is similar to the step S15 in FIG. 10. Then, by operating the R, θ and Z-axes, the wafer W is placed on the rotation standard stage 60 at the orienter 36 (S203). The step is similar to the step S16 in FIG. 10.

Then, as shown in FIGS. 5 and 7, the wafer W is caused to rotate, so that an eccentric volume Δr and an eccentric direction of the wafer W are detected by using an optical sensor 62 and a detecting-processing unit 64 (S204). The step is similar to the step S17 in FIG. 10. In the case, if there is no positional shift with respect to the repaired or replaced fork 48 and conveying arm body 46, the eccentric volume Δr is zero. However, if there is some positional shift, the shift appears as the eccentric volume Δr.

Then, based on the obtained eccentric volume Δr and eccentric direction, not only the appropriate position coordinates of the orienter teaching standard position P7 but also the appropriate position coordinates of the other all teaching standard positions P1–P6 are amended into respective new appropriate position coordinates (S205). In the case, the X-coordinate remains fixed, that is, the amendment is carried out only regarding the R-coordinate and the θ-coordinate, because the shift of the X-coordinate can be allowed for by the amendment of the R-coordinate and the θ-coordinate.

Then, the mapping operation i.e. the Z-axis adjustment as shown in FIG. 12 is conducted (S206). In the case, it is sufficient to conduct only the steps for obtaining the distance information showing the distance L1 between the mapping arm 50 and the fork 48 (S102 and S103 in FIG. 12), because the map information about the respective cassette containers has been already obtained. Then, based on the obtained distance information, all the Z-coordinates of the respective appropriate position coordinates of the respective teaching standard positions are amended into respective new appropriate Z-coordinates.

Thus, when the fork 48 and/or the conveying arm body 46 are repaired or replaced, all the teaching standard positions need not to be adjusted again. That is, a result from a positioning operation conducted with respect to a part of the teaching standard positions can be used for the other part of the teaching standard positions. Thus, a recovery positioning operation can be conducted very quickly.

Herein, the above explanation is given for the positioning operation conducted when the fork 48 or the conveying arm body 46 is repaired or replaced. However, a similar positioning operation may be conducted when a pick (second holding portion) or a transferring arm body is repaired or replaced.

Figure 14:
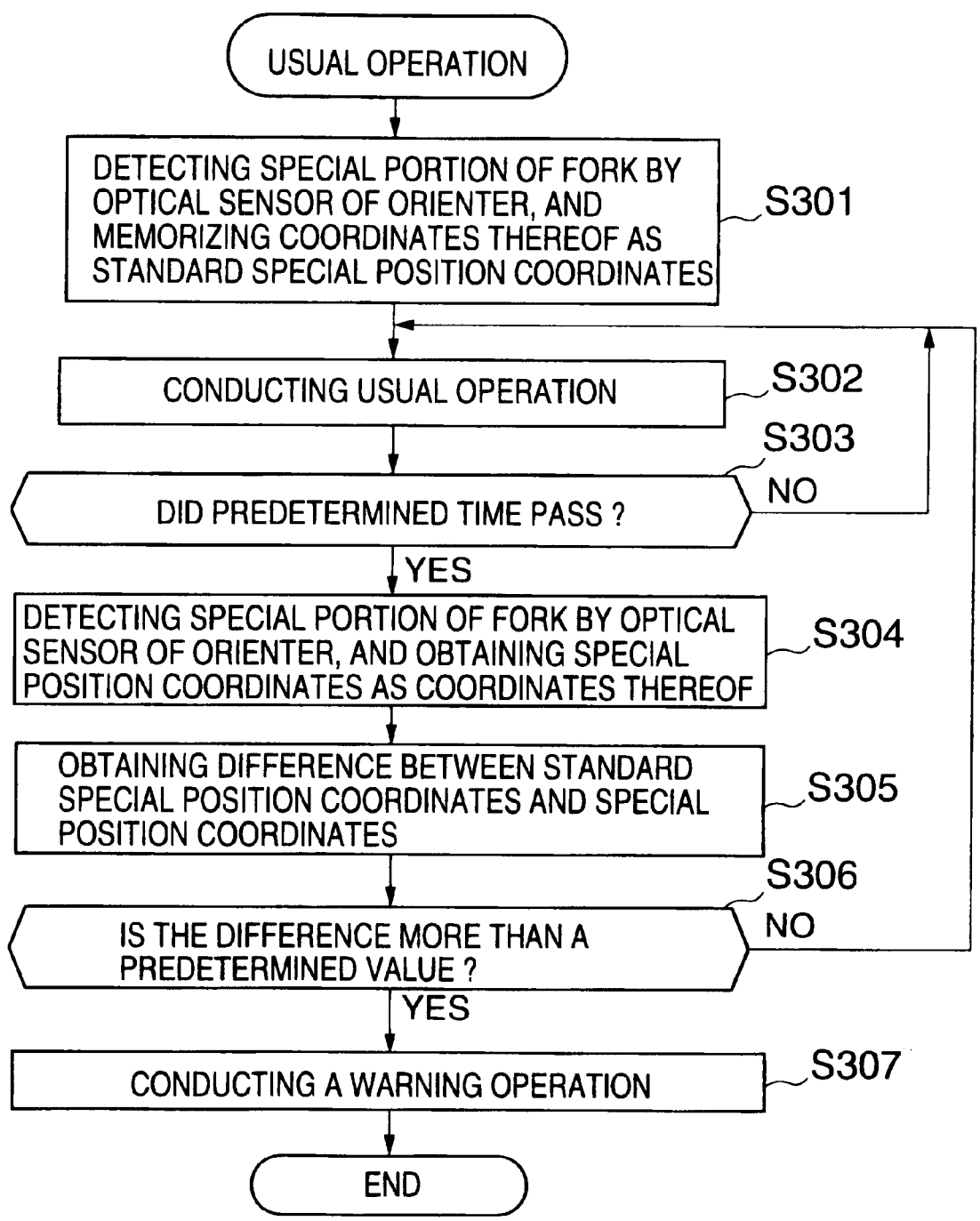
FIG. 14 is a flowchart showing a case of checking whether positional deviation of the fork is generated during a usual operation.

In addition, during usual operations after the above positioning operations, as a flowchart shown in FIG. 14, it is checked whether positional shift (deviation) of the fork 48 is generated or not. In the case, after the above positioning operations are completed, the conveying arm 20 moves to the orienter 36, a special portion of the convyeing arm 20 is detected by the optical sensor 62 (FIGS. 5 and 6) of the orienter 36, and coordinates of the special portion are memorized by the controlling unit 72 as standard special position coordinates (S301).

Figure 15:
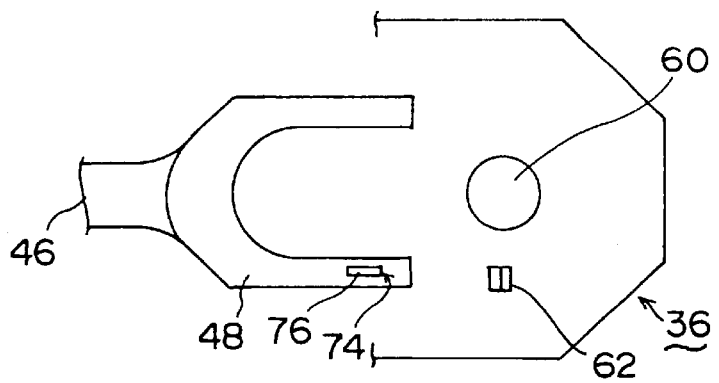
FIG. 15 is an explanatory view for explaining an operation of a case of detecting a special portion of the fork.

As shown in FIG. 15, a slit-like light-penetrable window 76 having a narrow width may be disposed at a portion of the fork 48 as the special portion 74 of the conveying arm 20. Alternatively, as shown in FIGS. 16 and 17, one tip edge 78 of the fork 48 may be defined as the special portion.

In the case shown in FIG. 15, for example the slit-like light-penetrable window 76 is detected by the optical sensor 62 while moving in the R-axis direction (the right direction in FIG. 15). A position wherein the light-penetrable window 76 goes away out of the sensor 62 may be defined as the standard special position coordinates.

Figure 16:
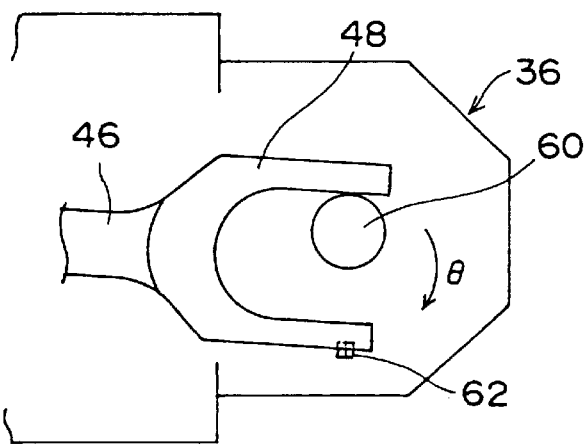
FIG. 16 is an explanatory view for explaining an operation of a case of detecting a special portion of the fork.
Figure 17:
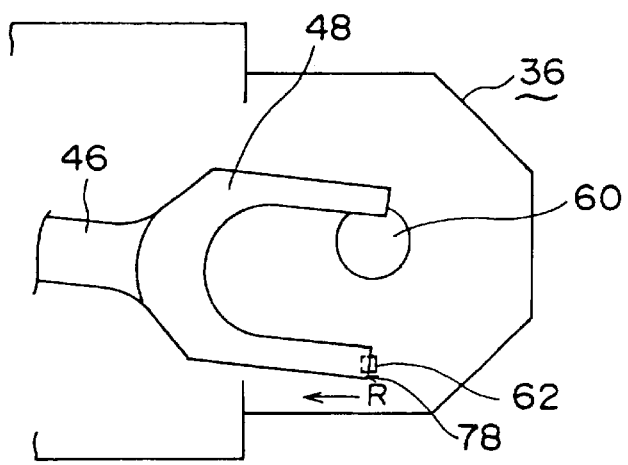
FIG. 17 is an explanatory view for explaining an operation of a case of detecting a special portion of the fork.

In addition, in the case shown in FIGS. 16 and 17, at first as shown in FIG. 16, the X, Z and R-axes remain fixed, the θ-axis is operated and an edge of a side surface of the fork 48 is detected by the optical sensor 62. Then, as shown in FIG. 17, the R-axis is operated so that the edge 78 of the fork 48 is detected by the optical sensor 62. Thus, the standard special position coordinates can be defined. The special portion can be defined in such a manner that the portion can be detected while the wafer W remains held.

The following explanation is given for the flowchart shown in FIG. 14. Next, the usual operations are started, that is, a wafer is conveyed by the conveying arm 20 and a process for the wafer W is continuously conducted (S302). When the conveying arm 20 is used for a long time, it is possible that some mechanical deterioration or the like may be generated in the conveying arm 20 itself. Thus, if the conveying arm 20 is used for a predetermined time (YES of S303), as conducted in the step S301, the conveying arm 20 is caused to move to the orienter 36. Then, coordinates of the special portion of the fork 48 are again detected by the optical sensor 62 of the orienter 36. The detected coordinates become special position coordinates (S304).

Next, the standard special position coordinates detected in the step S301 and the special position coordinates detected in the step S304 are compared in order to obtain difference between them (S305). Then, if the difference is less than a predetermined value (NO of S306), the state may be judged to be normal. Then, the usual operation resumes from the step S302. On the other hand, if the difference is not less than the predetermined value (YES of S306), it may be judged that the posture of the fork 48 has greatly changed from the original posture because of mechanical wear or the like. In the case, if the usual operation continues on, another element may collide with the fork 48, which may cause a trouble. Thus, in the case, the operations should be stopped immediately and a warning process should be carried out, for example a warning lamp or the like should be turned on in order to inform the operator of the state (S307). Thus, collision of the fork 48 with another element or another accident can be prevented.

Figure 18:
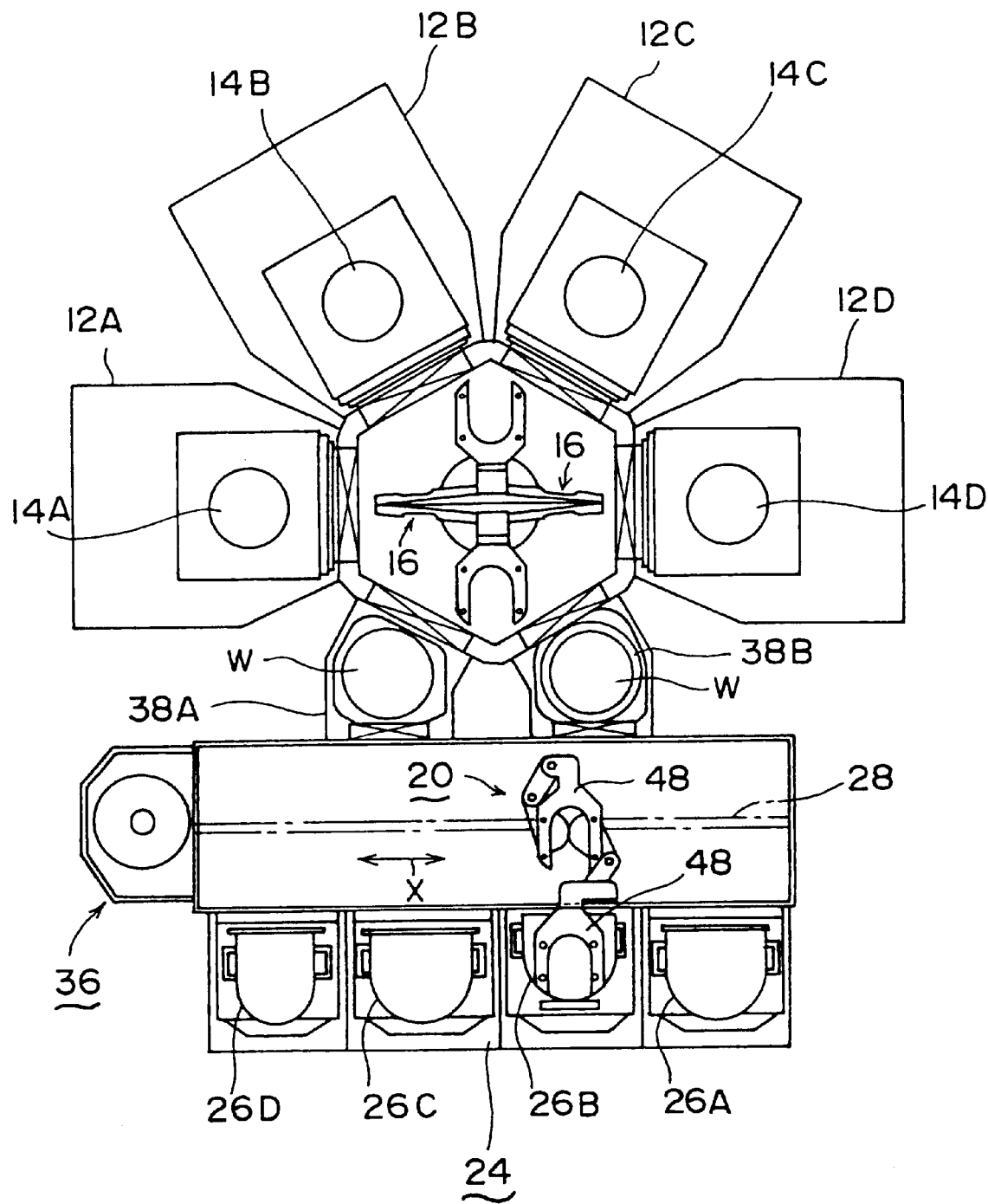
FIG. 18 is a schematic view of a cluster-tool unit wherein two conveying arm bodies and two transferring arm bodies are provided.

In the above respective embodiments, the conveying arm 20 has the one conveying arm body with the fork. However, this invention is not limited to the manner. As shown in FIG. 18, this invention can be applied to a conveying arm having two conveying arm bodies, each of which has a fork. In such a conveying arm, the two forks can integrally move in the Z-direction and in the θ-direction, but can be independently controlled in the R-direction. As positioning operations for such a conveying arm, the above positioning operations may be conducted for the respective forks.

In addition, in the above embodiments, the transferring arm 16 has the one transferring arm body with the pick. However, this invention is not limited to the manner. As shown in FIG. 18, this invention can be applied to a transferring arm having two transferring arm bodies, each of which has a pick.

In addition, in the above embodiments, the object to be processed is the semiconductor wafer. However, the object to be processed is not limited to the manner. Of course, this invention can be applied to a conveying system for LCD or the like that may be disposed for processing the LCD or the like.

In addition, the above structure of the conveying system is only an example. This invention can be applied to any other structure of the conveying system that can convey the wafer or the like by using the conveying arm.

Figure 19:
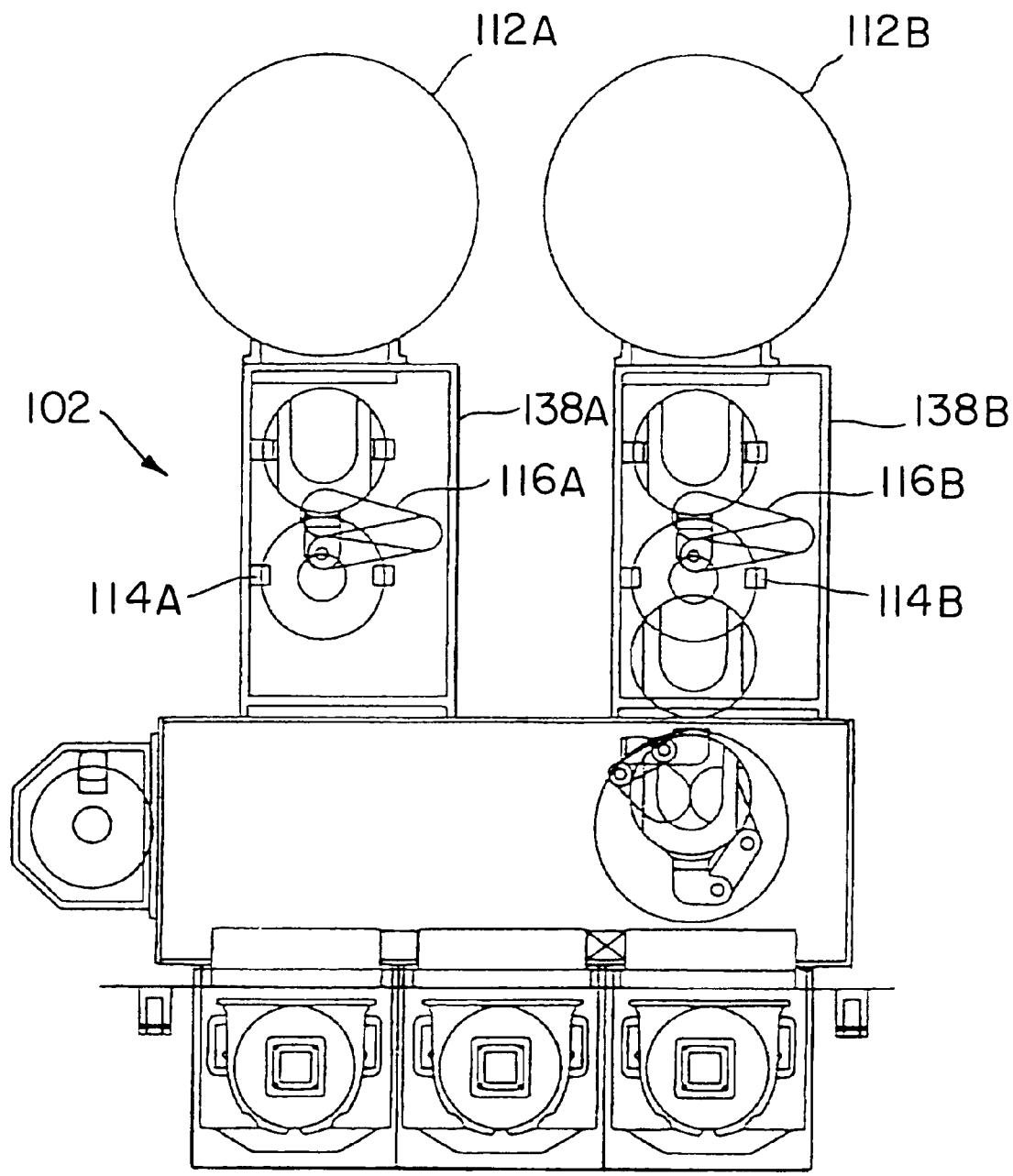
FIG. 19 is a schematic view of another example of conveying system.

For example, FIG. 19 shows another structure of the conveying system 102. In the system, there is no transferring chamber, but the processing chambers 112A and 112B are directly connected to the load-lock chambers 138A and 138B. In the case, the load-lock chambers 138A and 138B make pairs with the processing chambers 112A and 112B, respectively. Each of the load-lock chambers 138A and 138B includes an object-to-be conveyed stage 114A, 114B and a transferring arm 116A, 116B. The transferring arm 116A, 116B is not rotatable. Other structure is substantially the same as the cluster-tool unit shown in Fis. 1.

The object of the invention can be achieved by the conveying system 102 shown in FIG. 19 as well.

In addition, a step for confirming the appropriate position coordinates can be added.

That is, preferably, the method further includes: a step of conveying and placing an object W to be conveyed precisely positioned with respect to and held by the holding portion 48 onto the rotation standard stage 60, according to a control based on the appropriate position coordinates of the orienter teaching standard position O1; a step of detecting an eccentric volume and an eccentric direction of the object W placed on the rotation standard stage 60 by the position and posture detector 62; and a step of confirming the appropriate position coordinates of the orienter teaching standard position O1 based on the detected eccentric volume and the detected eccentric direction.

Similarly, preferably, the method further includes: a step of conveying and placing an object W to be conveyed precisely positioned with respect to each of the respective teaching standard positions P1–P6 and Q1–Q4 onto the rotation standard stage 60, according to a control based on the appropriate position coordinates of each of the teaching standard positions P1–P6 and Q1–Q4; a step of detecting an eccentric volume and an eccentric direction of the object W placed on the rotation standard stage 60 by the position and posture detector 62; and a step of confirming the appropriate position coordinates of each of the teaching standard positions P1–P6 and Q1–Q4 based on the detected eccentric volume and the detected eccentric direction.

An example of the latter case is explained with reference to FIG. 20. At first, based on designed values, provisional position coordinates of respective teaching standard positions are inputted (S401). Then, a roughly teaching operation is conducted to each of the teaching standard positions (S402).

Then, a wafer W is manually positioned and placed on the center of the fork 48 precisely (S403).

Then, the wafer W is conveyed onto the orienter 36, and an eccentric volume and an eccentric direction of the wafer W are detected (S404). Then, the provisional position coordinates of the orienter teaching standard position are amended into the appropriate position coordinates (S405). Then, the wafer W is manually positioned and set at another teaching standard position precisely (S406).

Then, the wafer W is conveyed onto the orienter, and an eccentric volume and an eccentric direction of the wafer W as well as a rotational position of the notch are detected (S407). If the detected eccentric volume is not less than a permissible level, based on the detected eccentric volume and the detected eccentric direction, the provisional position coordinates are amended into the appropriate position coordinates (S408). If the detected eccentric volume is less than the permissible level, the provisional position coordinates at that time become appropriate position coordinates (S410).

After the step S408, the wafer W is manually precisely positioned and set with respect to the same teaching standard position, again (S409). Then, the operation goes back to the step S407.

After the step S410, the controlling unit memorizes the detected rotational position of the notch (S411), and the above steps S406–S411 are conducted for all the teaching position coordinates except the orienter position coordinates (S412).

Figure 20:
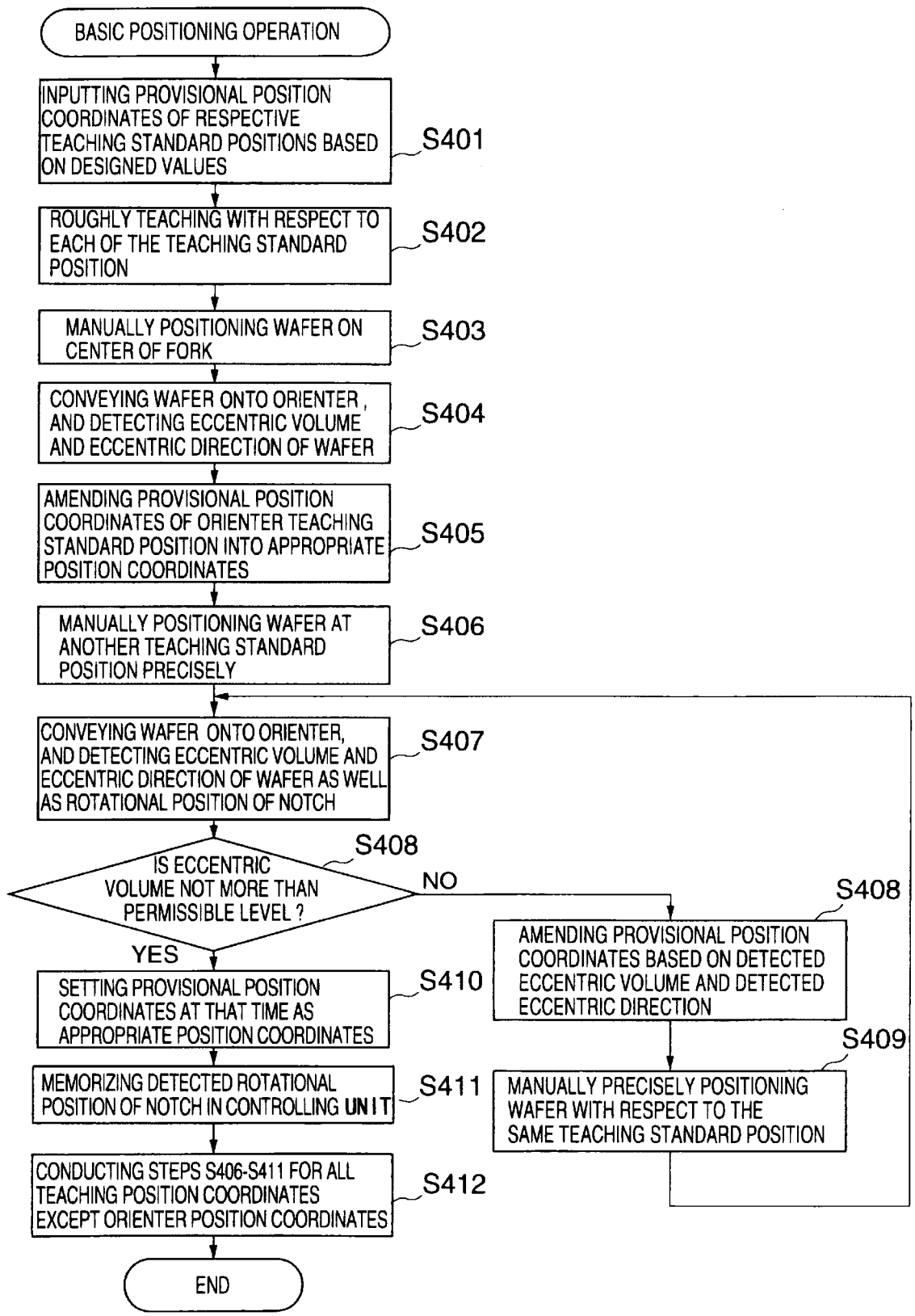
FIG. 20 is a flowchart of a case including a step of confirming the appropriate position coordinates.

By employing a loop-system as shown in FIG. 20 to confirm the appropriate position coordinates, the appropriate position coordinate can be obtained with desired accuracy.

In addition, the conveying system is preferably provided with a displaying unit that can display information about states, timings or the like of the respective steps for the operator.

What is claimed is:

1. A method for positioning a conveying system including;
   a conveying arm having:
      a conveying arm body that is able to contract, expand, rotate and move vertically, and
      a holding portion provided at a tip portion of the conveying arm body for holding an object to be conveyed,
   a moving mechanism for causing the conveying arm to move,
   at least one container stage disposed in a moving area of the holding portion for placing a cassette container that can contain a plurality of objects to be conveyed in a tier-like manner,
   a direction-position positioning unit having:
      a rotation standard stage disposed in the moving area of the holding portion, and
      a position and posture detector for detecting an eccentric volume and an eccentric direction of the object to be conveyed placed on the rotation standard stage, and
   a controlling unit that can control entire operations, wherein the holding portion is positioned with respect to a standard position,
   the method comprising;
      a step of inputting respective provisional position coordinates of an orienter teaching standard position that is a predetermined position on the rotation standard stage and a container teaching standard position that is a predetermined position in the cassette container placed on the container stage, into the controlling unit in advance,
      a step of conveying and placing an object to be conveyed precisely positioned with respect to and held by the holding portion onto the rotation standard stage, according to a control based on the provisional position coordinates of the orienter teaching standard position, a step of detecting an eccentric volume and an eccentric direction of the object to be conveyed placed on the rotation standard stage by the position and posture detector, a step of making appropriate position coordinates by amending the provisional position coordinates of the orienter teaching standard position based on the detected eccentric volume and the detected eccentric direction, a step of conveying and placing an object to be conveyed precisely positioned with respect to the container teaching standard position onto the rotation standard stage, according to a control based on the provisional position coordinates of the container teaching standard position, a step of detecting an eccentric volume and an eccentric direction of the object to be conveyed placed on the rotation standard stage by the position and posture detector, and a step of making appropriate position coordinates by amending the provisional position coordinates of the container teaching standard position based on the detected eccentric volume and the detected eccentric direction.

2. A method for positioning a conveying system according to claim 1, wherein the moving mechanism has a guide rail on which the conveying arm can slide, and the provisional position coordinates include an X-coordinate along the guide rail, an R-coordinate being a contraction or expansion volume of the conveying arm body, a θ-coordinate being a rotation volume of the conveying arm body and a Z-coordinate being a vertical movement volume of the conveying arm body.

3. A method for positioning a conveying system according to claim 1, wherein a load-lock chamber in which a vacuum can be formed is arranged in the moving area of the holding portion, the load-lock chamber having therein a object-to-be-conveyed stage for placing the object to be conveyed, and the method further comprising:

a step of inputting provisional position coordinates of a load-lock teaching standard position that is a predetermined position on the object-to-be-conveyed stage, into the controlling unit in advance, a step of conveying and placing an object to be conveyed precisely positioned with respect to the load-lock teaching standard position onto the rotation standard stage, according to a control based on the provisional position coordinates of the load-lock teaching standard position, a step of detecting an eccentric volume and an eccentric direction of the object to be conveyed placed on the rotation standard stage by the position and posture detector, and a step of making appropriate position coordinates by amending the provisional position coordinates of the load-lock teaching standard position based on the detected eccentric volume and the detected eccentric direction.

4. A method for positioning a conveying system according to claim 3, wherein the load-lock chamber is connected to a transferring chamber, the transferring chamber is connected to a processing chamber having therein a susceptor for placing the object to be conveyed, the transferring chamber has a transferring arm having:
a transferring arm body that is able to contract, expand and rotate, and
a second holding portion provided at a tip portion of the transferring arm body for holding an object to be conveyed, a nick is formed at a peripheral portion of the object to be conveyed, the position and posture detector can detect a position of the nick of the object to be conveyed, and the method further comprising:

a step of inputting provisional position coordinates of a susceptor teaching standard position that is a predetermined position on the susceptor, into the controlling unit in advance, a step of conveying and placing an object to be conveyed precisely positioned with respect to the susceptor teaching standard position to the load-lock chamber by the transferring arm, according to a control based on the provisional position coordinates of the susceptor teaching standard position, a step of conveying and placing the object to be conveyed placed in the load-lock chamber onto the rotation standard stage by the conveying arm, a step of detecting an eccentric volume, an eccentric direction and a position of the nick of the object to be conveyed placed on the rotation standard stage by the position and posture detector, a step of making appropriate position coordinates by amending the provisional position coordinates of the susceptor teaching standard position of the transferring arm based on the detected eccentric volume and the detected eccentric direction, and a step of causing the controlling unit to memorize the detected position of the nick as a positioning direction of the direction-position positioning unit.

5. A method for positioning a conveying system according to claim 4, wherein the number of the provided load-lock chambers is two, and the object-to-be-conveyed stage is arranged in each of the two load-lock chambers.

6. A method for positioning a conveying system according to claim 3, wherein the load-lock chamber is connected to a processing chamber having therein a susceptor for placing the object to be conveyed, the load-lock chamber has a transferring arm having:
a transferring arm body that is able to contract and expand, and
a second holding portion provided at a tip portion of the transferring arm body for holding an object to be conveyed, a nick is formed at a peripheral portion of the object to be conveyed, the position and posture detector can detect a position of the nick of the object to be conveyed, and the method further comprising:

a step of inputting provisional position coordinates of a susceptor teaching standard position that is a predetermined position on the susceptor, into the controlling unit in advance, a step of conveying and placing an object to be conveyed precisely positioned with respect to the susceptor teaching standard position to the load-lock chamber by the transferring arm, according to a control based on the provisional position coordinates of the susceptor teaching standard position, a step of conveying and placing the object to be conveyed placed in the load-lock chamber onto the rotation standard stage by the conveying arm, a step of detecting an eccentric volume, an eccentric direction and a position of the nick of the object to be conveyed placed on the rotation standard stage by the position and posture detector, a step of making appropriate position coordinates by amending the provisional position coordinates of the susceptor teaching standard position of the transferring arm and/or the provisional position coordinates of the load-lock teaching standard position of the conveying arm, based on the detected eccentric volume and the detected eccentric direction, and a step of causing the controlling unit to memorize the detected position of the nick as a positioning direction of the direction-position positioning unit.

7. A method for positioning a conveying system according to claim 6, wherein the load-lock chamber is provided as a pair with the processing chamber, and the object-to-be-conveyed stage is arranged in each of the load-lock chambers.

8. A method for positioning a conveying system according to claim 2, wherein the conveying arm has a mapping arm that can take map information of the objects to be conveyed in the cassette container, the mapping arm being horizontal to the conveying arm body, a light-emitting unit that can emit a level-detecting light in a horizontal direction is arranged in the moving area of the holding portion, a light-receiving unit that can receive the level detecting light emitted from the light-emitting unit is arranged, and the method further comprising:

a step of causing the conveying arm to relatively vertically move in a vicinity of the light-emitting unit by using the level-detecting light emitted from the light-emitting unit in the horizontal direction as a standard, and calculating distance information between the conveying arm body and the mapping arm, a step of taking the map information for each of cassette containers, and a step of making appropriate position coordinates by amending the provisional position coordinates about the X-coordinate, based on the distance information and the map information.

9. A method for positioning a conveying system according to claim 1, further comprising after the step of inputting the respective provisional position coordinates:

a step of roughly positioning the respective teaching standard positions, and a step of setting position coordinates obtained by roughly positioning as new provisional position coordinates.

10. A method for positioning a conveying system according to claim 2, further comprising:

a step of conveying and placing an object to be conveyed precisely positioned with respect to and held by the holding portion onto the rotation standard stage, after the holding portion or the conveying arm body has been repaired or replaced, a step of detecting an eccentric volume and an eccentric direction of the object to be conveyed placed on the rotation standard stage by the position and posture detector, and a step of making new appropriate position coordinates by amending R-coordinates and θ-coordinates of all the appropriate position coordinates of the conveying arm, based on the detected eccentric volume and the detected eccentric direction.

11. A method for positioning a conveying system according to claim 2, further comprising:

a step of conveying and placing an object to be conveyed precisely positioned with respect to and held by the holding portion onto the rotation standard stage, after the holding portion or the conveying arm body has been repaired or replaced, a step of detecting an eccentric volume and an eccentric direction of the object to be conveyed placed on the rotation standard stage by the position and posture detector, and a step of making new appropriate position coordinates by amending X-coordinates and R-coordinates of all the appropriate position coordinates of the conveying arm, based on the detected eccentric volume and the detected eccentric direction.

12. A method for positioning a conveying system according to claim 2, further comprising:

a step of causing the conveying arm to relatively vertically move and calculating distance information between the conveying arm body and a mapping arm by using a level-detecting light emitted in a horizontal direction as a standard, after the holding portion or the conveying arm body has been repaired or replaced, a step of taking map information for each of cassette containers, and a step of making appropriate position coordinates by amending Z-coordinates of all the appropriate position coordinates of the conveying arm, based on the distance information and the map information.

13. A method for positioning a conveying system according to claim 4, further comprising:

a step of conveying and placing an object to be conveyed precisely positioned with respect to and placed on the second holding portion to the load-lock chamber by the transferring arm, after the second holding portion or the transferring arm body has been repaired or replaced, a step of conveying and placing the object to be conveyed placed in the load-lock chamber onto the rotation standard stage by the conveying arm, a step of detecting an eccentric volume and an eccentric direction of the object to be conveyed placed on the rotation standard stage by the position and posture detector, and a step of making new appropriate position coordinates by amending all the appropriate position coordinates of the transferring arm, based on the detected eccentric volume and the detected eccentric direction.

14. A method for positioning a conveying system according to claim 1, wherein during an operation of the conveying system after the appropriate position coordinates has been made, the conveying system is adapted to detect a positional deviation of the holding portion that is generated during the operation, by calculating coordinates of a special portion of the conveying arm not holding the object to be conveyed at any time by using the position and posture detector of the direction-position positioning unit or a level detecting unit in the moving area.

15. A method for positioning a conveying system according to claim 14, wherein the special portion of the conveying arm is a light-penetrable window formed at the conveying arm.

16. A method for positioning a conveying system according to claim 14, wherein the special portion of the conveying arm is a special edge portion of the conveying arm.

17. A method for positioning a conveying system according to claim 1, wherein the number of the conveying arm bodies and the number of the holding portions are two, respectively.

18. A method for positioning a conveying system according to claim 4, wherein the number of the transferring arm bodies and the number of the second holding portions are two, respectively.

19. A method for positioning a conveying system according to claim 1, further comprising:

a step of conveying and placing an object to be conveyed precisely position ed with respect to and held by the holding portion onto the rotation standard stage, according to a control based on the appropriate position coordinates of the orienter teaching standard position, a step of detecting an eccentric volume and an eccentric direction of the object to be conveyed placed on the rotation standard stage by the position and posture detector, and a step of confirming the appropriate position coordinates of the orienter teaching standard position based on the detected eccentric volume and the detected eccentric direction.

20. A method for positioning a conveying system according to claim 1, further comprising:

a step of conveying and placing an object to be conveyed precisely positioned with respect to each of the respective teaching standard positions onto the rotation standard stage, according to a control based on the appropriate position coordinates of each of the teaching standard positions, a step of detecting an eccentric volume and an eccentric direction of the object to be conveyed placed on the rotation standard stage by the position and posture detector, and a step of confirming the appropriate position coordinates of each of the teaching standard positions based on the detected eccentric volume and the detected eccentric direction.

* * * * *